(12) United States Patent
Chen

(10) Patent No.: US 7,701,006 B2
(45) Date of Patent: Apr. 20, 2010

(54) METHOD OF PRODUCING A LOW-VOLTAGE POWER SUPPLY IN A POWER INTEGRATED CIRCUIT

(75) Inventor: Xingbi Chen, Chengdu (CN)

(73) Assignee: University of Electronic Science and Technology, Chengdu, Sichuan (CN)

( * ) Notice: Subject to any disclaimer, the term of this patent is extended or adjusted under 35 U.S.C. 154(b) by 0 days.

(21) Appl. No.: 12/351,182

(22) Filed: Jan. 9, 2009

(65) Prior Publication Data
US 2009/0284306 A1 Nov. 19, 2009

(30) Foreign Application Priority Data
May 14, 2008 (CN) .................. 2008 1 0097388

(51) Int. Cl.
*H01L 29/76* (2006.01)
(52) U.S. Cl. ................ 257/341; 257/401; 257/E29.257
(58) Field of Classification Search ................ 257/288, 257/341, 401, 500, E29.257
See application file for complete search history.

(56) References Cited

U.S. PATENT DOCUMENTS

| | | | |
|---|---|---|---|
| 6,504,352 B2 | 1/2003 | Halberstadt | |
| 6,778,411 B2 | 8/2004 | Huang | |
| 6,998,681 B2 | 2/2006 | Chen | |
| 7,282,765 B2 * | 10/2007 | Xu et al. | ...................... 257/343 |

\* cited by examiner

*Primary Examiner*—Quoc D Hoang
(74) *Attorney, Agent, or Firm*—Pillsbury Winthrop Shaw Pittman, LLP

(57) ABSTRACT

In a chip containing high-voltage device with a semiconductor substrate of a first conductivity type, a method of implementing low-voltage power supply is provided, wherein the electrical potential of an isolated region of a second conductivity type in a surface portion is used as one output terminal or as a voltage by which a transistor is controlled to provide output current for a low-voltage power supply. The other output terminal could be either terminal of the two that apply high voltage to high-voltage device or could be a floating terminal. Using this method, a low-voltage power supply can be implemented not only for the low-voltage integrated circuit (I) in a power IC containing one high-voltage device, but also for the low-voltage integrated circuit in a power IC having totem-pole connection or CMOS connection. As there is no need to implement depletion mode device in the chip, the fabrication cost is reduced.

9 Claims, 16 Drawing Sheets

METHOD OF PRODUCING A LOW-VOLTAGE POWER SUPPLY IN A POWER INTEGRATED CIRCUIT

CROSS REFERENCE TO RELATED APPLICATIONS

This application claims priority to Chinese application no. 200810097388.6 filed May 14, 2008, the contents of which are incorporated by reference herein in their entirety.

FIELD OF THE INVENTION

This invention relates to power integrated circuit, and more particularly relates to a semiconductor device and its application in low-voltage power supply.

BACKGROUND OF THE INVENTION

In a power IC, a power device is controlled and examined by low-voltage integrated circuits. The voltage of the power supply for a low-voltage integrated circuit should be much lower than the voltage of the power supply for a power device. Although a low-voltage power supply can be realized by a switch formed by high-voltage devices, which can convert high-voltage power supply to low-voltage power supply through a converter, at least one low-voltage power supply is necessary for the initial switching operation. The low-voltage power supply can be a charged capacitor and it can be charged by connecting it to a high-voltage terminal through a resistor.[1] In order to reduce the cost, an active resistor is always used, which must be a normally-on device (for example, a depletion mode high-voltage MOST). And the "off" state of the normally-on device is realized when the capacitor is charged up to a certain voltage.[2] However, power devices are mostly normally-off devices. A higher fabrication cost may be incurred due to that both normally-off and normally-on high-voltage devices have to be implemented in one chip.

REFERENCES

[1] Fengtai Huang, "start-up circuit for Power converters with controller", U.S. Pat. No. 6,778,411 B2 (Aug. 17, 2004);
[2] Johan Christiaan Halberstadt, "On Chip Current Source", U.S. Pat. No. 6,504,352 B2 (Jan. 7, 2003);
[3] Xing Bi Chen, U.S. Pat. No. 6,998,681 B2 (February 2006).

SUMMARY OF THE INVENTION

The object of present invention is to implement a semiconductor device, which can provide a low-voltage source for power integrated circuit (IC) without implementation of depletion mode device.

In order to solve the problem stated above, according to an embodiment of present invention, a semiconductor device is proposed, which comprises a semiconductor substrate of a first conductivity type and at least one first region of a second conductivity type located underneath a first major surface of said semiconductor device; an external reverse bias voltage is applied across said substrate of a first conductivity type and said first region of a second conductivity type;

wherein at least one second region of a second conductivity type is formed underneath said first major surface, said second region of a second conductivity type is isolated from any one of said first region of a second conductivity type; under an external applied reverse bias voltage, at least one said second region of a second conductivity type has undepleted (neutral) portion at an intermediate electrical potential and is surrounded by the depleted region of said substrate, wherein said intermediate electrical potential is between the potential of neutral portion of said substrate of a first conductivity type and the potential of first region of a second conductivity type;

said second region of a second conductivity type with intermediate electrical potential is an initiation region of a low-voltage power supply;

a low-voltage power supply is produced directly on two terminals, wherein one terminal is a contact to said initiation region and another terminal is a contact to any other neutral portion, or indirectly on two output terminals of a normally-off three-terminal semiconductor device, wherein one input terminal of said normally-off three-terminal semiconductor device is connected to said initiation region and another input terminal is in common with one of two output terminals of said normally-off three-terminal semiconductor device.

According to another embodiment of present invention, said normally-off three-terminal semiconductor device is an enhancement-mode MOSFET; the source-body region of said MOSFET is formed in a first region of a second conductivity type; the source region is a small region of a first conductivity type and is formed inside the source-body region; the drain region of said MOSFET is the substrate of a first conductivity type; the input terminal of said MOSFET is the gate of said MOSFET and one of said two output terminal is the source of said MOSFET.

According to still another embodiment of present invention, said initiation region of low-voltage power supply is simultaneously connected to a bypass circuit, which is used to control the electrical potential of said initiation region.

Said semiconductor device can be a high-voltage semiconductor device, a medium-voltage device or a low-voltage device, wherein said first conductivity is n-type and said second conductivity is p-type; or said first conductivity is p-type and said second conductivity type is n-type.

Furthermore, a diode and a capacitor are connected in series between the two output terminals; two terminals of said capacitor are used to provide current for a low-voltage IC.

Further, said terminal located in said initiation region is connected indirectly through a second region of a first conductivity type, wherein said second region of a first conductivity type is inside of said initiation region.

According to still further another embodiment of present invention, a low-voltage power supply provided by any of semiconductor device according to embodiment stated above, which is used as the power supply for the low-voltage IC for control of said semiconductor device.

According to still further another embodiment of present invention, two low-voltage power supplies can be implemented, which are used for the power supplies for the low-voltage drivers for the high-side high-voltage device and the low-side high-voltage device, respectively, in a totem-pole connection, wherein said low-side high-voltage device includes the paralleled lateral interdigitated MOST unit formed in the surface portion, a first region of a second conductivity type having the highest voltage with substrate as reference, and the floating voltage region whose voltage can approach from zero to almost the highest taking the substrate as reference; the region of the power supply for the driver of said low-side high-voltage device is surrounded by a ring of a first conductivity type formed in the substrate, and said ring is surrounded in turn by a ring of the first region of a second conductivity type, which is also used as the source-body region of the lateral MOST;

said low-side high-voltage device has a first layer which is directly connected to the source-body region; the impurity density of the first layer is defined as the amount of the effective ionized impurities per area in the first layer which is varied with distance and ranges from $D_0$ to $2D_0$, where $D_0$ is the impurity density of a second conductivity type in the depletion region of the heavily-doped side of a one-sided abrupt parallel-plane junction under the highest reverse bias; said first layer is covered by an even-number layer of a first conductivity type, which includes at least a second layer, and possibly includes odd-number layers of a second conductivity type, wherein each layer is sorted in numerical order from said first layer to the last layer at surface; all of odd-number layers except the first layer are directly connected to the first region, or connected to the first region at finger end, or connected to the first region via a device across which there is a very small voltage dropped; the ionized impurity density should be no larger than $2D_0$ in the portion close to the first region of a second conductivity type, and the ionized impurity density should be no larger than $1.8D_0$ in a portion close to the floating voltage region with its voltage changeable from zero to almost the highest; the overall effective impurity density of the low-side high-voltage device, which is obtained by subtracting the sum of the effective impurity density of even-number layers from the sum of the effective impurity density of odd-number layers, decreases gradually or stepwisely with the increase of the distance from the device to the first region of a second conductivity type, and approaches zero in the floating voltage region where the voltage can be varied from zero to almost the highest taking the substrate as reference; said impurity density is obtained by dividing the sum of the ionized impurity by the area, wherein the sum of the ionized impurity is obtained in a surface region whose dimension is much smaller than the width of the depletion region of a one-sided abrupt parallel-plane junction under a highest reverse bias; the effective impurity density of the first region of a second conductivity type is no smaller than $D_0$; when the voltage of the highest-voltage region of said interdigitated lateral MOST approaches the voltage of the lowest-voltage region, for layers except the first layer, only a tiny portion corresponding to the build-in potential is depleted and most of other potions are undepleted neutral portions;

the source region of said interdigitated lateral MOST is located in the first region of a second conductivity type; the drift region is even-number layers and the drain of the low-side high-voltage device is formed by connection of each even-number layer in the floating voltage region with a conductor on the surface, which is the tub electrode also; said interdigitated lateral MOST is surrounded by a ring of a semiconductor of a second conductivity type in a portion close to its drain region, said ring is surrounded in turn by a ring of a semiconductor of a first conductivity type which is surrounded by the second region of a second conductivity type;

said high-side high-voltage device is a common vertical MOST, whose source-body region is the second region of a second conductivity type and is connected to the tub;

the region of the low-voltage source for the low-voltage driver of the high-side high-voltage device is surrounded by a ring in a portion of the substrate of the first conductivity type, and said ring is in turn surrounded by source-body region of each vertical MOST unit, or partially surrounded by source-body regions of some vertical MOST units and the remaining part is surrounded by a portion of the semiconductor substrate close to the high-side high-voltage device.

According to still another embodiment of present invention, a semiconductor device for application is provided, wherein a low-voltage power supply is implemented in the neutral portion of the second region of a second conductivity type isolated from the first region of a second conductivity type without implementing depletion mode device. As a result, the overall fabrication cost of the power IC is reduced.

DETAILED DESCRIPTION OF THE INVENTION

This invention and examples of its application are presented in the following.

Figure 1:
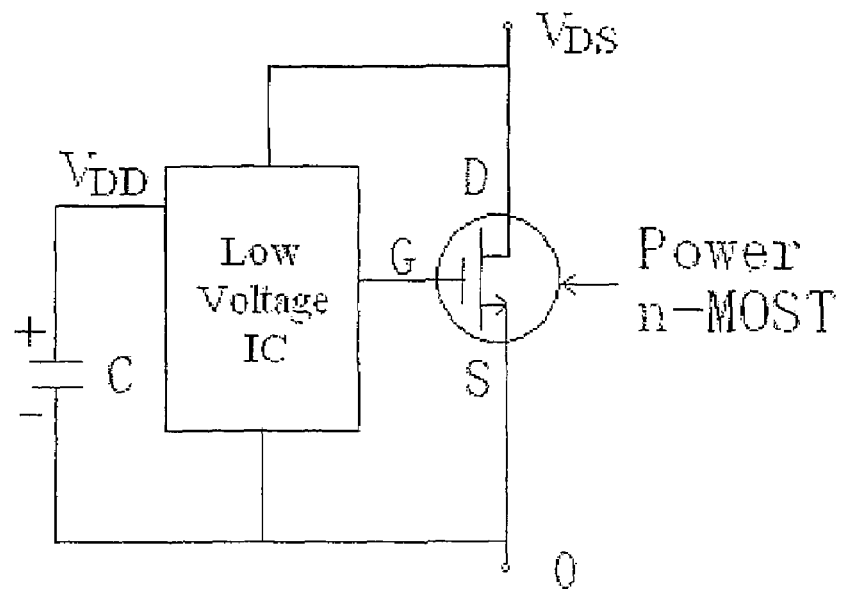
FIG. 1 schematically shows a high-voltage power MOST with a high-voltage power supply controlled by a low-voltage integrated circuit with a low-voltage power supply.

FIG. 1 shows a power n-MOST, which may be connected to the high-voltage power supply via a series load. There should be an external applied reverse voltage $V_{DS}$ between the drain electrode D and the source electrode S of the power n-MOST. The current of the power n-MOST is controlled by the voltage between gate and source generated by a low-voltage IC. The IC is driven by a power supply with a positive voltage, $V_{DD}$, taking S as reference. The power supply of voltage $V_{DD}$ is realized by utilizing a charged capacitor C as illustrated in FIG. 1. Normally $V_{DD}$ is much smaller than $V_{DS}$ and the capacitor must be charged by the external applied power supply of high-voltage.

Figure 2:
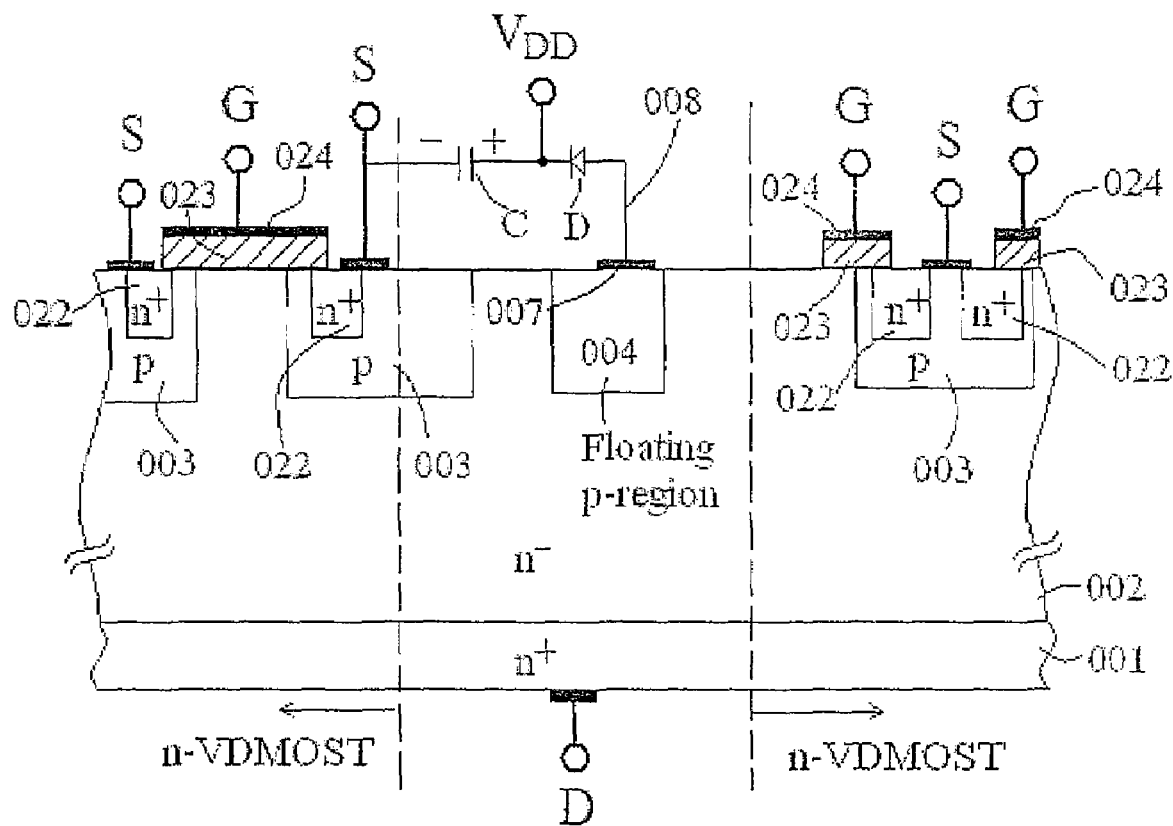
FIG. 2 schematically shows a cross section view of a low-voltage power supply implemented in a p-type floating region in an n-VDMOST.

The power MOST in FIG. 1 being an. n-VDMOST is discussed firstly. FIG. 2 schematically illustrates that a power supply of a low-voltage $V_{DD}$ shown in FIG. 1 is realized by charging the capacitor C by utilizing an isolated p-type floating region in a surface portion. In this figure, the left portion on the left dashed line and the right portion of the right dashed line all belong to the n-VDMOST. 001 is the drain region ($n^+$ substrate region) of the VDMOST, which is connected to the drain electrode D. 002, 003 and 022 are the $n^-$-drift region, the $p^-$-source-body region and the $n^+$-source region respectively, and they are in contact with the source electrode S at the surface. 023 and 024 are the gate dielectric layer and gate conductor layer respectively, There is an isolated p-type floating region 004 in a portion between the two dashed lines. It is called "p-type floating region", wherein "floating region" means the region does not have a fixed electrical potential. For convenience, assuming the source electrode S has a potential of zero, when the drain voltage $V_{DS}$ is increased to a certain level, the n-type region between 003 and 004 will be fully depleted, inducing a positive voltage on 004. This positive voltage is applied through the electrode 007 on top of the p-type floating region and a wire 008 to the anode of a diode D. The cathode of this diode is connected to a capacitor C with an output terminal at the connection point having an output voltage $V_{DD}$. Another terminal of the capacitor C is connected to the source electrode S. When $V_{DS}$ is increased to a certain value, the voltage on 004 turns on the diode, leading to a current through the diode D to the capacitor. The capacitor is then charged, generating a voltage $V_{DD}$ across the capacitor and the low voltage power supply is realized.

As solid bold lines in FIG. 2 represent electrode contacts. Normally, in order to form a good contact, a heavily doped undepleted region may be formed below the electrode. Such heavily doped undepleted regions are not shown explicitly in the figures of this invention except for special cases.

Of course, the p-type floating region can be a type of floating field limiting ring. But for maintaining a certain voltage, it is not necessary to be a ring. It can also be an isolated island without connection to neighbouring p-type region.

Figure 3:
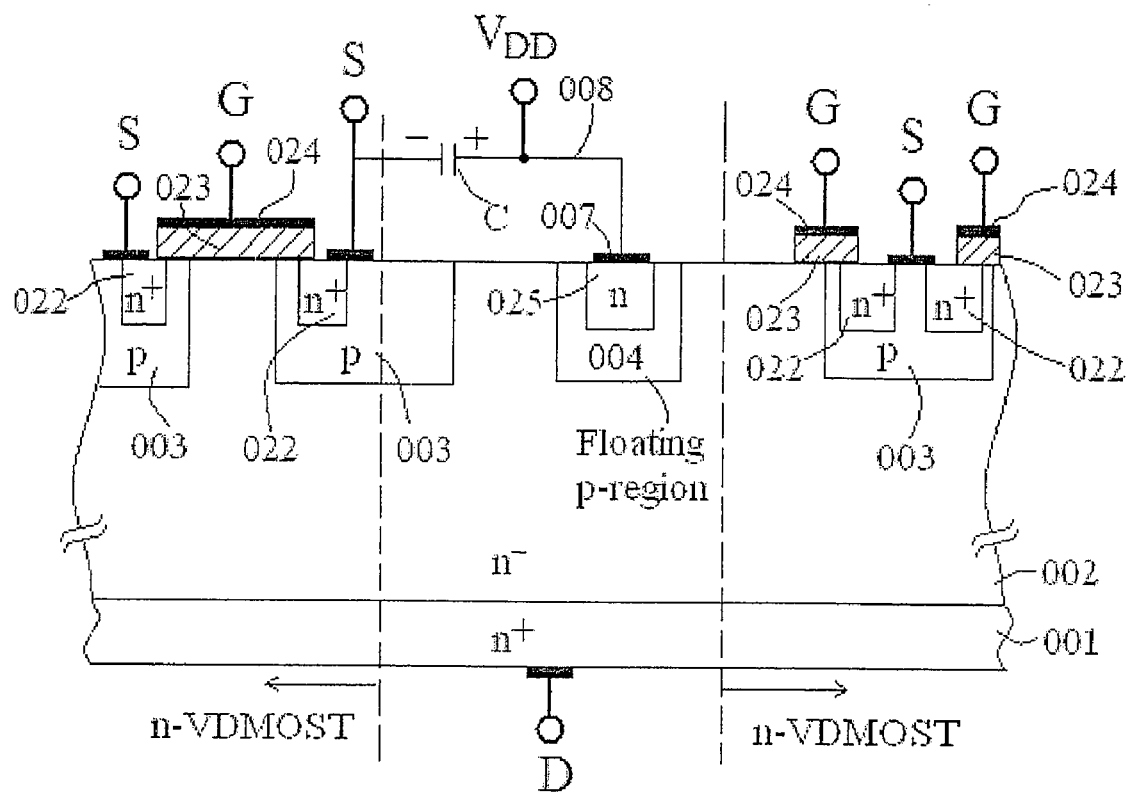
FIG. 3 schematically shows an n-type region formed in the p-type region for the replacement of the diode D in FIG. 2.

When the VDMOST in FIG. 2 is turned-on, $V_{DS}$ is very small, and p-type region 004 has a positive voltage with respect to $n^-$ region 002, leading to a current through p-type region 004 to $n^-$ region 002. Such a current may consume the charges in the capacitor C. The diode D as illustrated in the figure can prevent such a charge leakage. In fact, the diode can be implemented within the IC as shown in FIG. 3. FIG. 3 shows that an n-type region 025 is formed in a portion of the p-type floating region, and electrode 007 is subsequently formed on top of surface of 025, which is connected to the "+" terminal of the capacitor via a wire 008.

Figure 4:
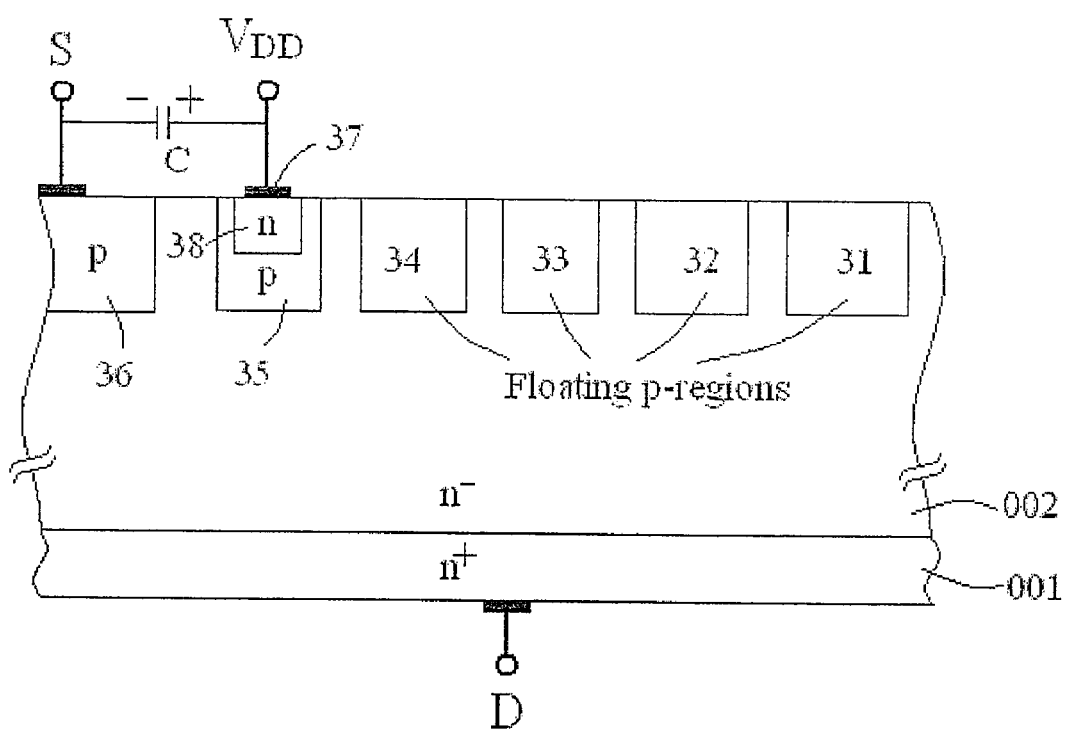
FIG. 4 schematically shows a low-voltage power supply realized by one of floating field limiting rings at the edge termination of a VDMOST.

The p-type floating region 004 illustrated in FIG. 3 can be a part of an edge termination. FIG. 4 schematically shows the situation that floating field limiting rings are used as the edge termination. In this figure, 31, 32, 33, 34 are all floating field limiting rings. Moreover, 35 also acts as a floating field limiting ring. An n-type region 38 is formed inside 35 and a conductor 37 is deposited on the top of region 38.

It is well-known that field plates can be connected to floating field limiting rings. The floating region in the present invention can also be connected to field plate if it is necessary.

The low-voltage power supply can charge outer capacitor shown in FIG. 1. The voltage of the outer capacitor is related to $V_{DD}$. $V_{DD}$ is in turn related to the physical parameters, geometric parameters and etc. In fact $V_{DD}$ can be controlled by a low-voltage circuit. For example, a switch can be inserted between 007 and the terminal marked with "+" of C in FIG. 3, which can be switched off if the voltage on the capacitor exceeds a certain level. Such control techniques will not be discussed in present invention.

The outer capacitor is used for meeting the requirement of big current for a long duration. If no such a requirement, it is no need to use this outer capacitor. In addition, if requirement for capacitance is not too big and the requirement for voltage-sustaining is not too tough, the capacitor can be implemented inside the IC through modern semiconductor technology.

Figure 5A:
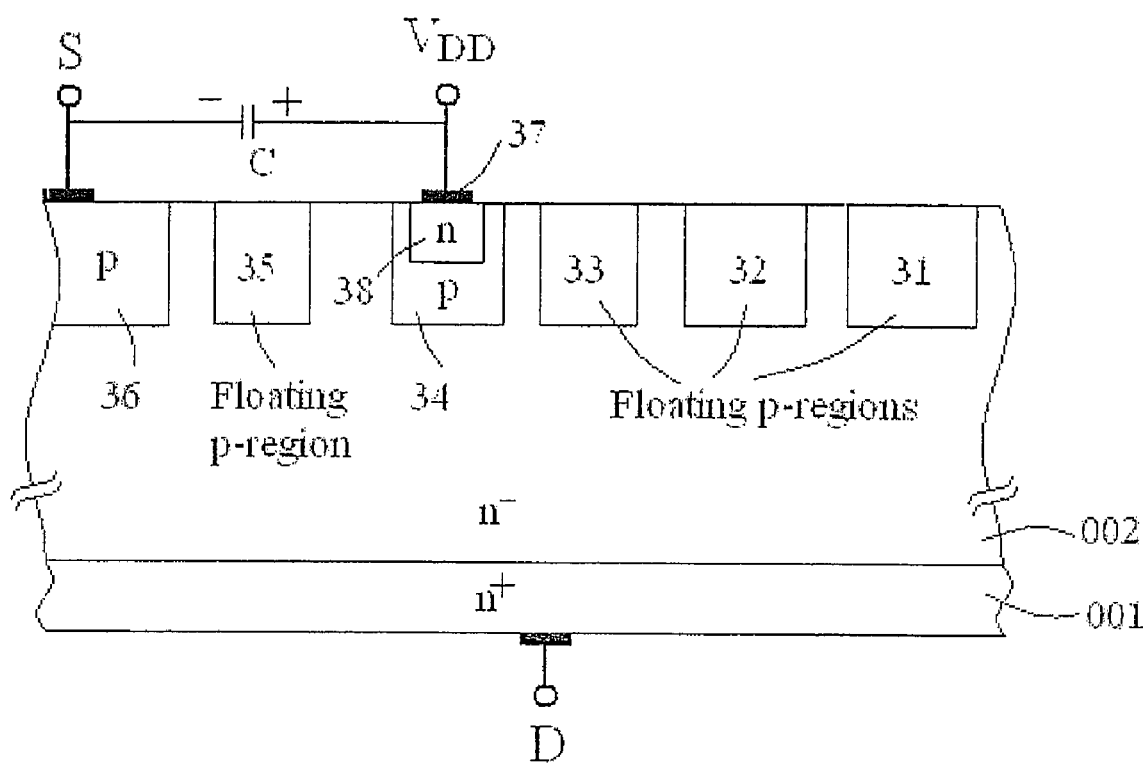
FIG. 5(a) schematically shows a low-voltage power supply realized by one of floating field limiting rings. The p-type floating region used for implementing the low-voltage power supply is the second floating field limiting ring instead of a first floating field limiting ring.
Figure 5B:
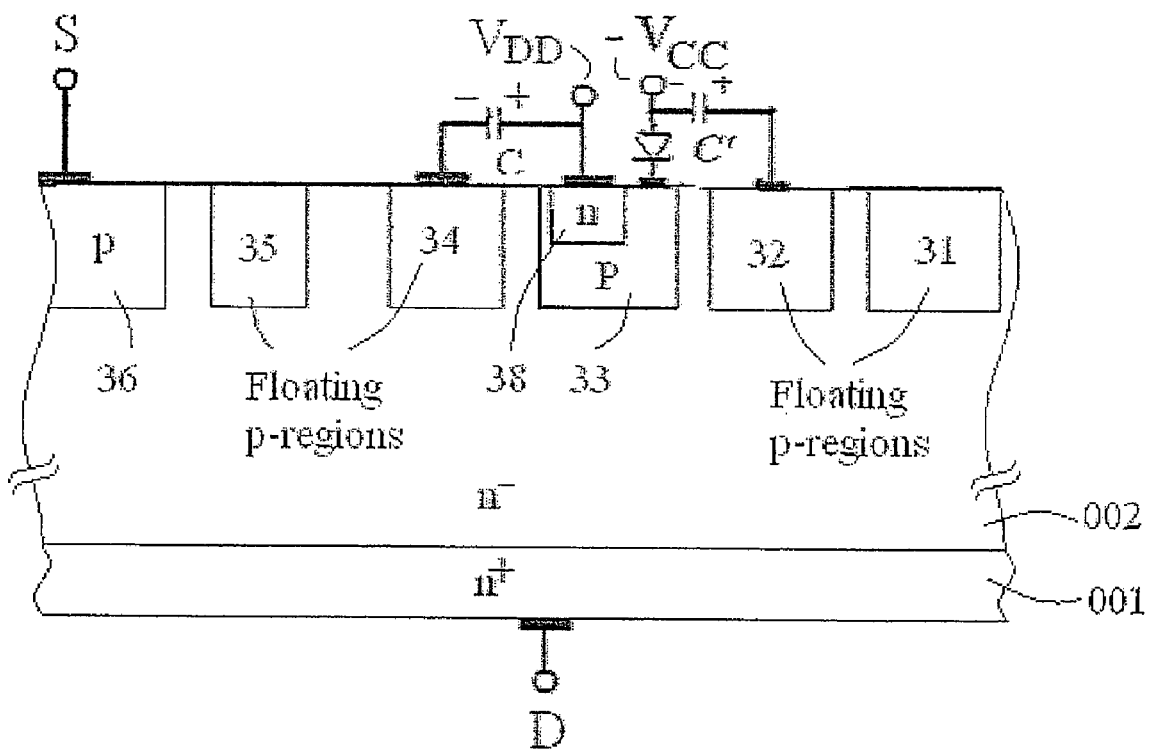
FIG. 5(b) schematically shows a situation that a floating region is used for implementing a positive low-voltage power supply for one of other floating regions as well as a negative low-voltage power supply for another floating region.

In the above method, an isolated p-type region is chosen in a portion most close to the electrode S. Actually, any isolated p-type region can be chosen for implementing low-voltage power supply, provided it has a fully depleted area of the substrate up to another p-type region, which is taken as a voltage reference. FIG. 5 schematically illustrates such a situation. In this figure, the p-type region 34 is used for implementing low-voltage power supply instead of 35, which is the most close to the p-type region 36 connected to electrode S. An n-type region 38 is formed in a portion of 34, and on 38 there is a contact 37 which is connected to the low-voltage power supply terminal $V_{DD}$.

The above described external applied reverse voltage $V_{DS}$ is applied across the source-body (S) and the bottom of the substrate (D). The p-type source-body can be called as the major region. In FIG. 5(*a*), if the reverse bias approaches a certain level, the n⁻ region surrounding the p-type regions 36, 35, 34, 33, 32, and 31 may be depleted. If there appears undepleted neutral portions inside each of those p-type regions, the electrical potential of those p-type regions should increase in the sequence of 36, 35, 34, 33, 32, and 31. The neutral portion of each p-type region can be used for implementing a positive voltage power supply for any p-type region in its left portion and can be used for implementing a negative voltage power supply of any p-type region in its right portion. FIG. 5(*b*) shows the situation that the neutral portion of p-type region 33 can be used for implementing a power supply of a positive voltage $V_{DD}$ for p-type region 34, and can also be used for implementing a negative voltage power supply $-V_{CC}$ for p-type region 32. The n-type region 38 in this figure has the same function as region 38 in FIG. 5(*a*). The capacitor C', which works as the negative voltage power supply, is connected to a diode for preventing the charge leakage from C' caused by hole injection from p-type region 32 to n⁻ region 002. This diode can be implemented as following: an n-type region is formed in a portion of p-type region 33 and connected by an ohmic contact at the surface, making them to be equal-potential; a p-type region is formed in a portion of the n-type region and the p-type region is connected to "−" terminal of C' via a wire.

Figure 6:
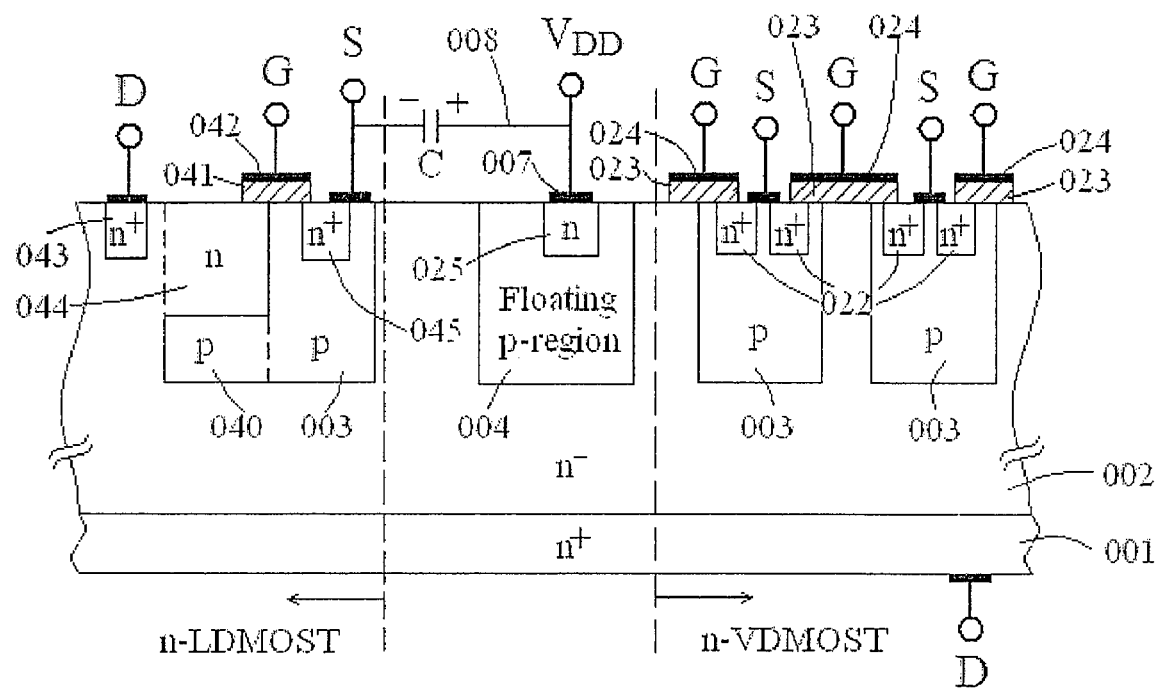
FIG. 6 schematically shows a situation that a low-voltage power supply is implemented when the left portion of the n-VDMOST in FIG. 2 is replaced by an n-LDMOST.

An edge termination of variation lateral doping can be used to replace the n-VDMOST in the left portion of FIG. 2. FIG. 6 shows an n-LDMOST implemented by optimum variation lateral doping technique (see Ref. [3]) for such a replacement. The n-LDMOST itself comprises a surface voltage-sustaining region formed by p-type region 040, an n-type region 044. The source region, the source-body region, the drain region, the gate dielectric layer, and the gate are n⁺-region 045, p-type region 003, n⁺ region 043, the dielectric layer 041, and the gate conductor 042, respectively. In this figure, the n-VDMOST includes source region 022, source-body region 003, gate dielectric layer 023, and gate 024. The positive voltage terminal $V_{DD}$ of low-voltage power supply is formed on top of the n-type region 025 in a portion of the p-type floating region 004 between the n-LDMOST and the n-VDMOST. 025 is connected to positive voltage terminal $V_{DD}$ of low-voltage power supply via conductor 007 and connected to the capacitor C via wire 008. The negative terminal of capacitor C is connected to the source electrode S.

By utilizing the structure in FIG. 6, the n-LDMOST works as both a device and an edge termination of n-VDMOST, and thus saves the chip's area.

Figure 7:
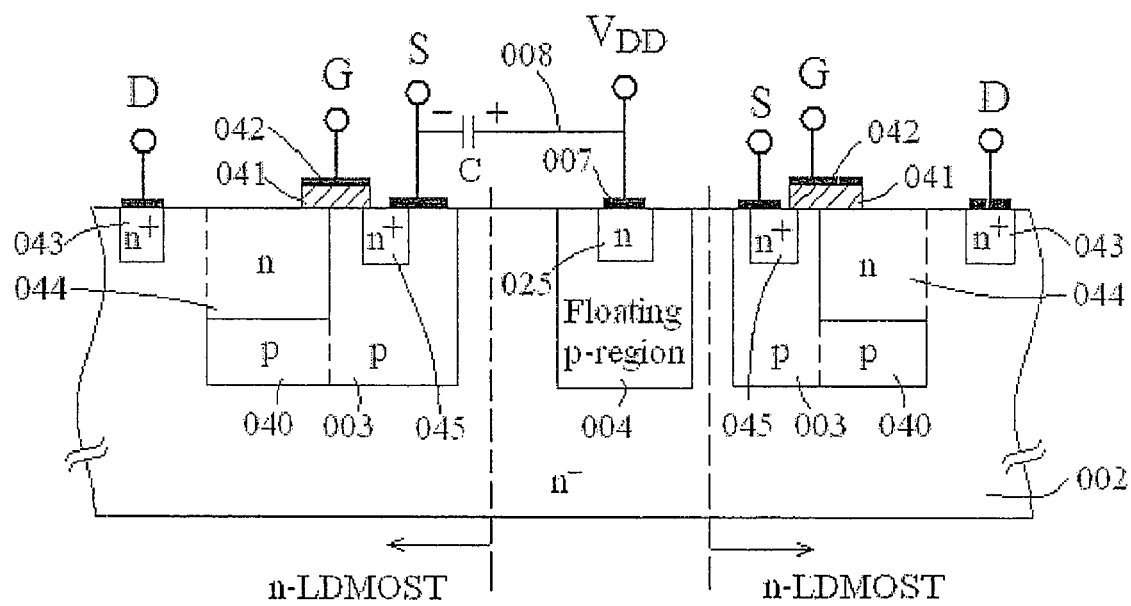
FIG. 7 schematically shows a situation that a low-voltage power supply is implemented when the right portion of the n-VDMOST in FIG. 6 is replaced by an n-LDMOST.

Of course, one can also realize a positive voltage power supply to the source electrode S inside an n-LDMOST, which is shown in FIG. 7. A type of n-LDMOST in Ref. [3] is presented in this figure, wherein a source-body p-type region 003 and an n⁺-source region 045 are connected to source electrode S; the surface voltage-sustaining region is composed of n-type region 044 and p-type region 040. The gate dielectric layer 041 is covered by gate conductor 042, on which gate electrode G is formed. The drain electrode D is formed on top of drain region 043. The p-type floating region 004 has a positive voltage to source electrode S. A diode is formed by p-type region 004 and n-type region 025. 025 is connected to the electrode of the low-voltage power supply $V_{DD}$ and can charge capacitor C via wire 008.

Figure 8A:
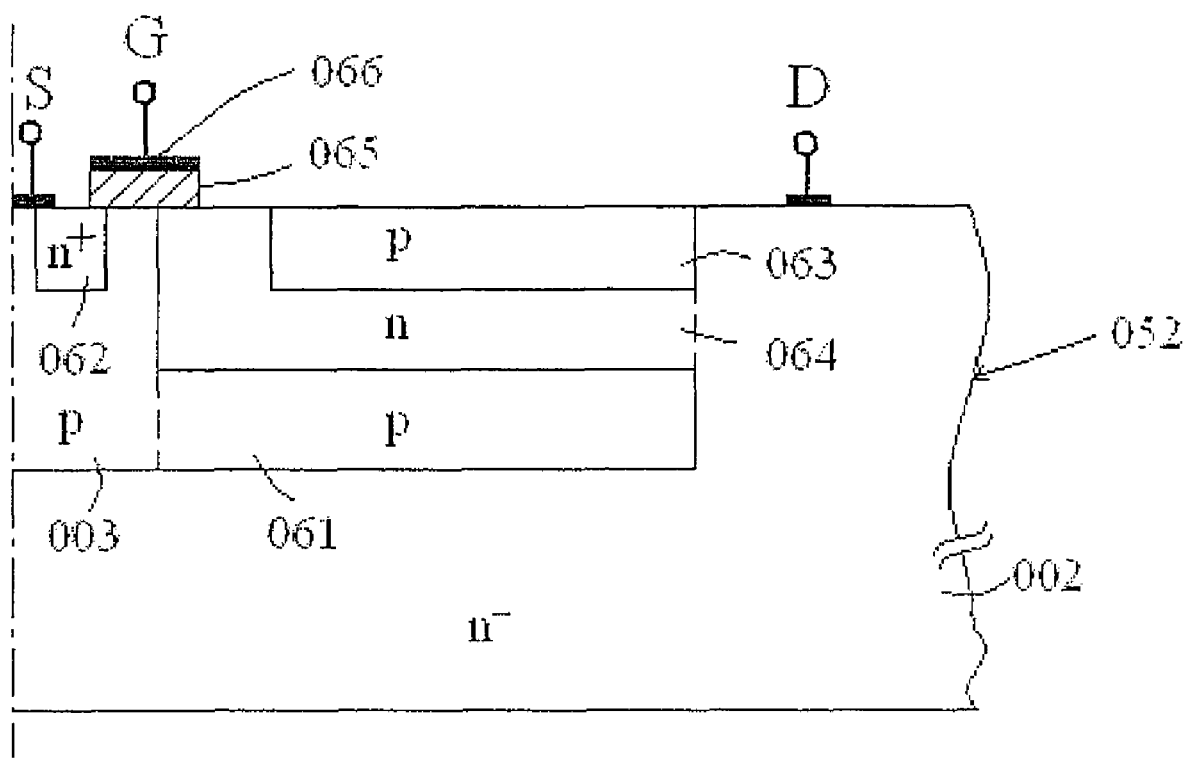
FIG. 8(a) schematically shows the cross section view of an n-LDMOST in prior art (Reference [3]).
Figure 8B:
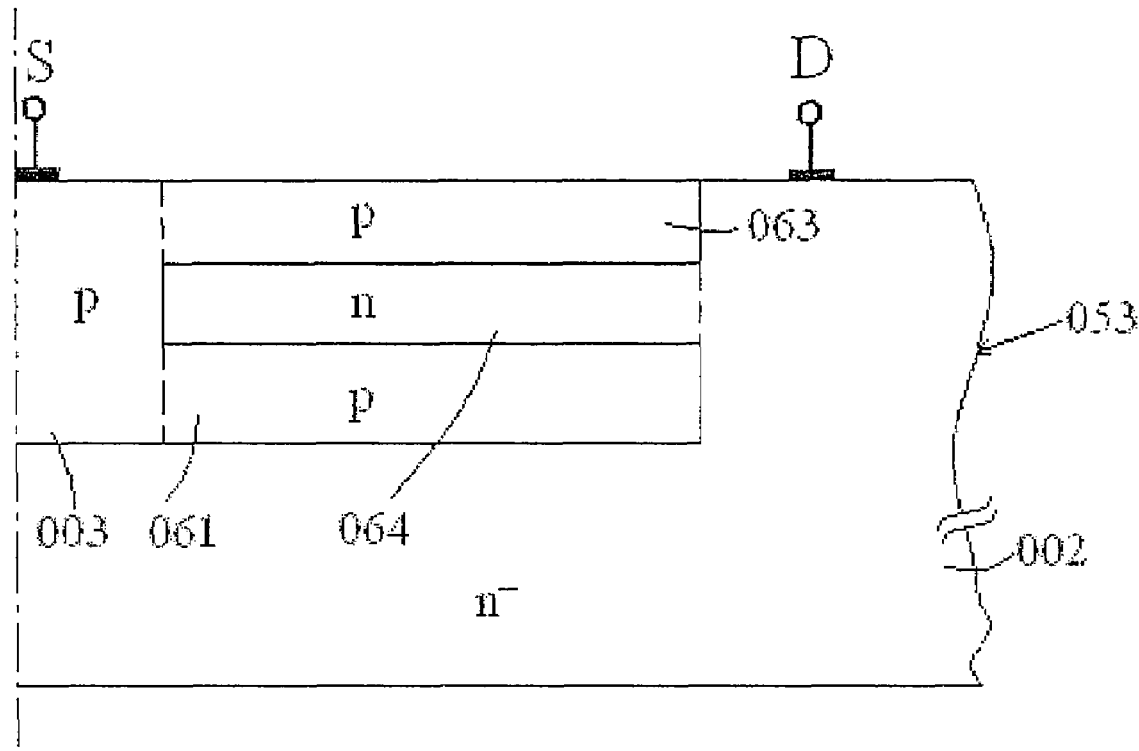
FIG. 8(b) schematically shows a cross section view of an n-LDMOST. The voltage-sustaining region is the same as that of the device in FIG. 8(a), while the portion of the upper p-type layer is directly contacted with the source region.
Figure 8C:
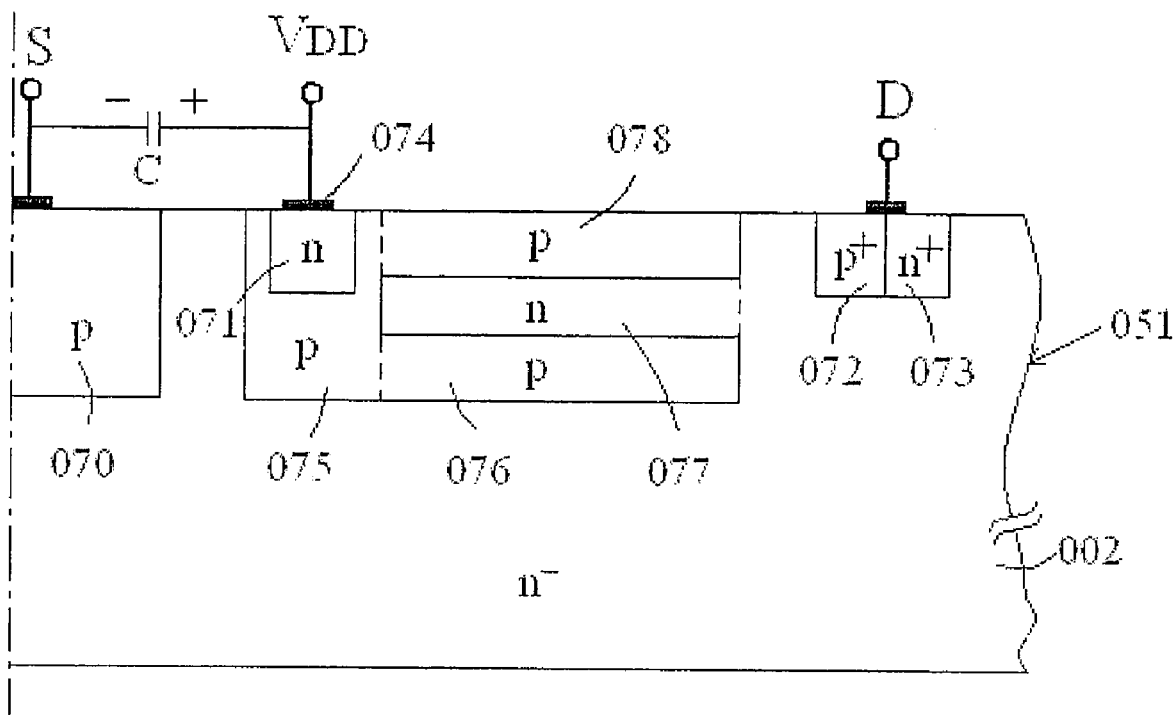
FIG. 8(c) schematically shows a cross section view of a low-voltage power supply implemented with the voltage-sustaining structure in FIG. 8(a).

The structure presented in FIG. 7 can save the area of chip by integrating the low-voltage power supply and the lateral power device together. The method is illustrated in FIG. 8. A structure stated in Ref. [3] is used for implementing the voltage-sustaining region of n-LDMOST in FIG. 8(*a*). The n-LDMOST includes the p-type region 063 on the top, the n-type region 064 underneath 063 and the p-type region 061 underneath 064. The n⁺-source region 062 and the source-body region 003 are in contact with the source electrode S. The gate G is formed by depositing conductor layer 066 on a gate dielectric layer 065. The drain region is in contact with substrate via a small heavily doped n-type region, which is not shown in the figure.

In order to connect the left portion of surface p-type layer 063 to the p-type region 003 directly instead of through an outer connection, a method is shown in FIG. 8(*b*), which is used to replace a portion of the structure in FIG. 8(*a*).

FIG. 8(*c*) shows the method of implementing the low-voltage power supply for this high-voltage device, wherein the p-type region 078, being a part of voltage-sustaining region, is not connected to source electrode S directly, but is isolated by an n⁻-region from the p-type region 070, which is in contact with source electrode; An n-type region 071 is formed in the surface portion of p-type region 075, constructing a diode. 071 is in contact with conductor 074, which forms electrode $V_{DD}$ and thus can charge the capacitor C. The voltage-sustaining region is formed by 076, 077 and 078, that is like the structure formed by 061, 064, and 063 described above. The p⁺ region 072 is used for providing hole current to p-type region 078 and p-type region 076. The n⁺ region 073 makes a connection between the drain D and undepleted portion in 002.

Figure 9:
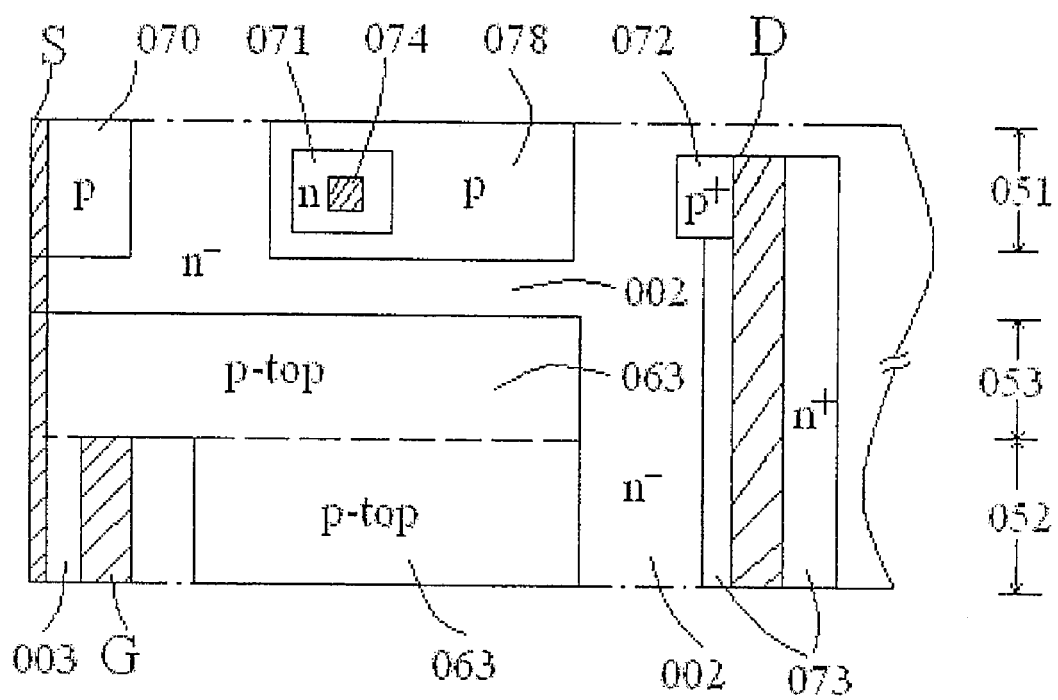
FIG. 9 schematically shows a top view of a device in which the structures in FIGS. 8(a), 8(b), and 8(c) are integrated together. The p-type region 078 in FIG. 8(c) is isolated from the p-type region in FIG. 8(b) by an n-region.

In order to integrate the structures shown in FIGS. 8(*a*), 8(*b*) and 8(*c*) all-together. A method is shown in FIG. 9, which is a top view. In this figure, a small n⁻ region 002 is used to isolate 076, 077 and 078 regions from the power device regions 061, 064 and 063. The regions 052, 053 and 051 represent the top views of FIGS. 8(*a*), 8(*b*) and 8(*c*), respectively. The voltage-sustaining regions of 051 and 053 are isolated from each other by an n⁻ region 002. Also, 071 and 002 should be isolated each other. This figure can be repeated periodically in a device provided an n⁻ region 002 is added at the top of this figure.

Figure 10:
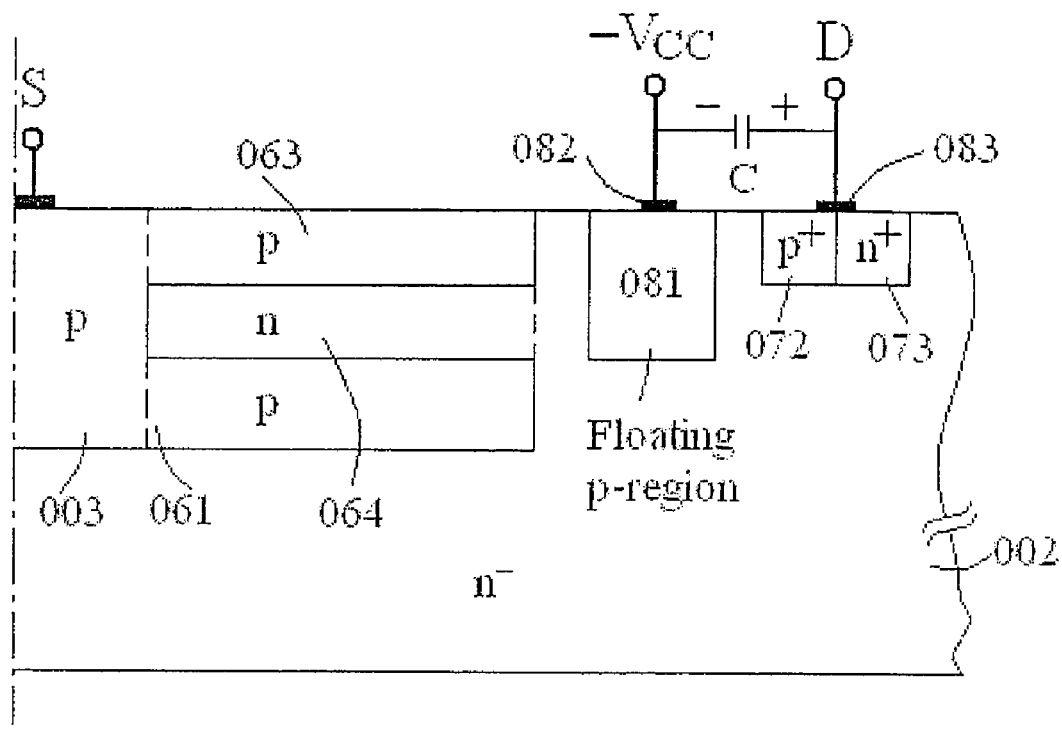
FIG. 10 schematically shows a cross section view of the device structure of a negative low-voltage power supply using electrode D as the reference.

By utilizing isolated p-type region, not only a positive voltage power supply with S as reference can be implemented as shown in FIG. 2-9, but also a negative voltage power supply with D as reference can be implemented as schematically illustrated in FIG. 10. The method of implementing voltage-sustaining region is the same as that shown in FIG. 8. Under a certain value of external applied voltage, the depletion region can reach the right edge of the isolated p-type floating region 081. In addition, electrode D is connected to both the heavily doped p⁺ region 072 and heavily doped n⁺ region 083, making the depleted area of substrate 002 to be confined within 072. Thus, p-type region 081 has a negative voltage $V_{CC}$ with D as reference. Capacitor C can be charged as there is a potential deference between the isolated p-type region 081 and terminal D. The current for charging the Capacitor C starts from substrate 002 via 083, then C, then 082, then 081, then through the depleted region between 081 and 063 and/or 064, and finally reaches 003 to terminal S.

It should be pointed out here that the method of implementing the negative low-voltage power supply may be not good if the voltage-sustaining region is realized by field limiting rings instead of variation lateral doping technique. This is due to that if the $V_{DS}$ is not high enough, the depleted area of substrate 002 maybe confined to a certain field limiting ring instead of beyond the right portion of 081, and the negative voltage can not be generated.

Figure 11:
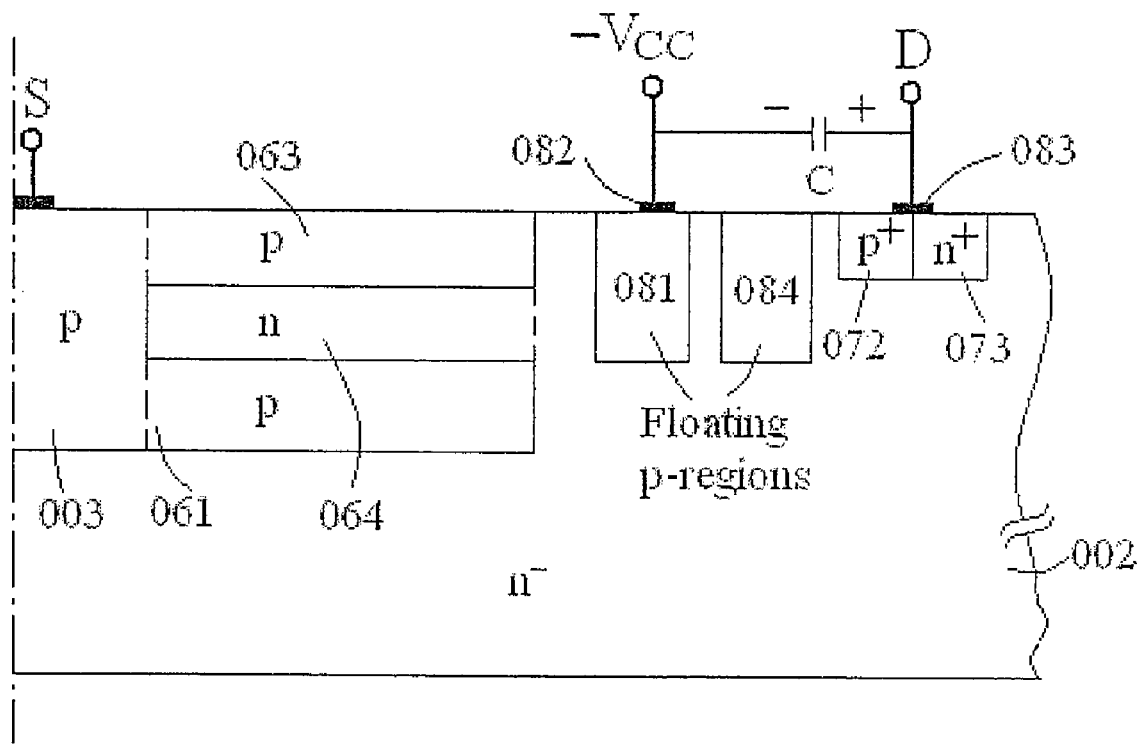
FIG. 11 schematically shows a cross section view of the device structure similar to that in FIG. 10. A higher negative low-voltage power supply can be provided with this device.

A higher $V_{CC}$ than that from FIG. 10 can be obtained by forming another p-type floating region in the right portion of the p-type floating region 081 in FIG. 10. FIG. 11 shows such a situation. Here, in addition to electrode 082 and the p-type floating region 081, one more isolated p-type region 084 is set. In this case, the distance of the variation lateral doping region, including 063, 064 and 061, can be reduced as compared to that in FIG. 10, so that more voltage drop beyond the variation lateral doping region than that of FIG. 10 is produced.

Above methods are used for implementing low-voltage power supply with a p-type floating region by charging a capacitor used as the power supply. There is probably a disadvantage in real applications, that the charging current may be too large or too small. In this invention, another method to overcome this disadvantage is also provided. The method is to implement a low-voltage power supply with a MOST device controlled by the potential of isolated p-type region.

Figure 12:
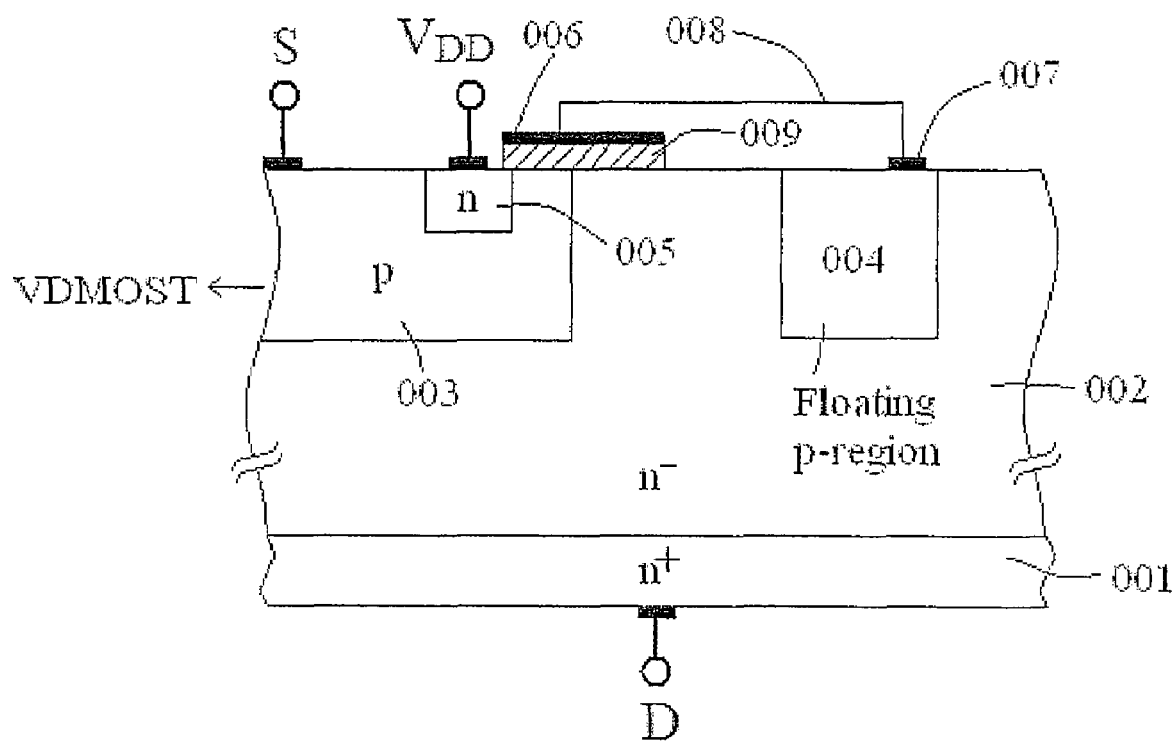
FIG. 12 schematically shows that a power supply of a voltage $V_{DD}$ can be generated by the turning-on of the n-MOST where the gate voltage is supplied by the potential of p-type floating region.

FIG. 12 shows a structure that a gate voltage is provided by a p-type floating region with a higher electrical potential than that of the terminal S, and the n-type region of major junction in contact with terminal S is charged to a higher potential than the major junction.

In this figure, the left portion of the cutting line is an n-VDMOST. 001 is the drain region (n⁺ substrate) of the VDMOST, which is in contact with the drain electrode D at the bottom. 002 is n⁻-drift-region and 003 is the source-body region, which is in contact with the source electrode S on the top. The edge termination is extended from the right edge of 003 to the right and even to the outside portion of the figure. There is a p-type floating region 004 in this edge termination region. For convenience, assuming the source electrode S has an electrical potential of zero. When the drain voltage $V_{DS}$ is increased to a certain level, the n-type region between 003 and 004 will be fully depleted, thus a positive voltage on 004 is induced. This positive voltage is applied through the electrode 007 on top of the p-type floating region and the wire 008 to the gate 006. There is an insulator under the gate 006, which is the gate dielectric layer. An n-MOST is formed including drain region 002, source region 005 and source-body region 003. When $V_{DS}$ is increased to a certain level, a conductive n-type channel in region 003 underneath 006 will be formed. The n-MOST is then turned-on and current flows from 005 to 002, making 005 positive. Therefore a low-voltage power supply having a voltage of $V_{DD}$ is produced.

Figure 13:
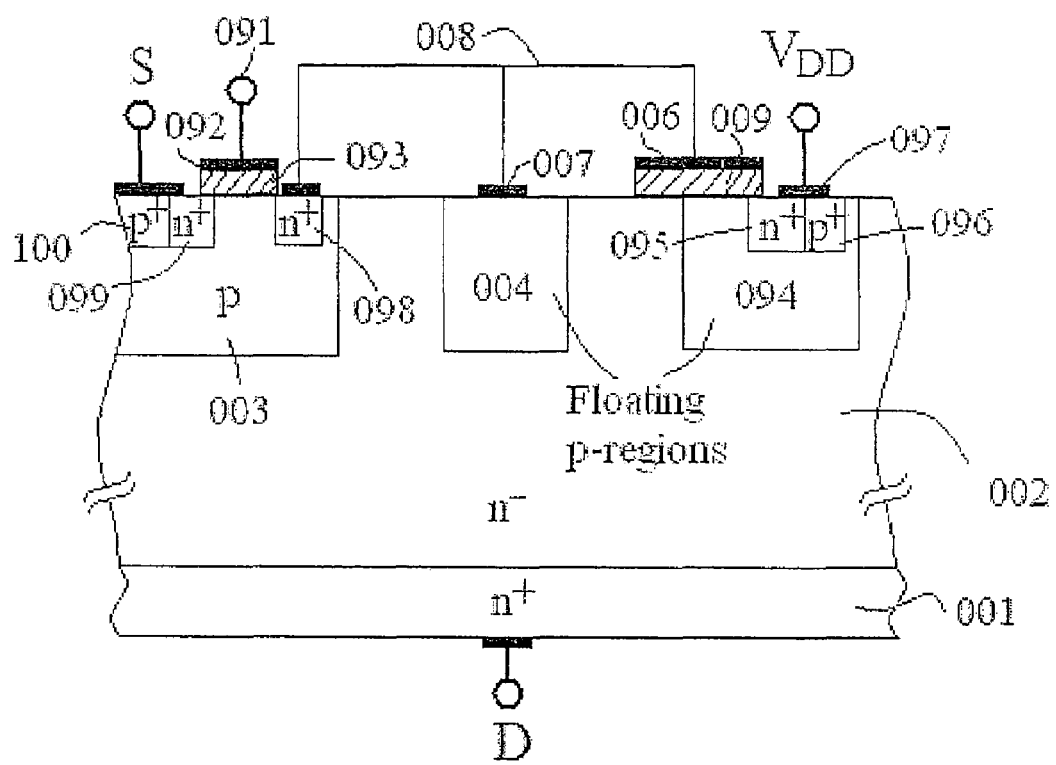
FIG. 13 schematically shows a situation that a voltage $V_{DD}$ is generated when the n-MOST is turned-on by the controlled potential of p-type floating region.

Now, if $V_{DD}$ approaches a very high level, the junction between n-type region 005 and p-type region 003 may be breakdown. For solving this problem, the output terminal of the low-voltage power supply can be formed in another p-type floating region as shown in FIG. 13, where the p-type region 094 is the output region of the low-voltage power supply. When $V_{DS}$ is high enough, it can make $V_{DD}$ higher than zero. This is due to that the p-type region 004 has a potential applied on a gate electrode 006 and an insulator layer 009 under the gate 006 is deposited on part of the surface of semiconductor 002, and when the potential of 006 is increased to a certain level, an inversion layer is formed in the p-type region 094 and electrons flows from n⁺-region 095 to the substrate 002 via the inversion layer, making $V_{DD}$ positive. $V_{DD}$ is a positive voltage power supply to the electrode S. Since the value of $V_{DD}$ can be controlled by adjusting the potential of gate 006. This adjustment can be realized by connecting p-type floating region 004 to the n⁺-region 098 in the p-type region 003, which is connected to the electrode S. Note that an n-MOST is formed in the portion between 098 and electrode S. This n-MOST includes the n⁺-source region 099, drain region 098, p⁺ region 100 for the source-body contact, gate dielectric layer 093, gate 092 on which there is an electrode 091. The potential of 091 is generated by a circuit not shown in FIG. 13. When the potential of 091 approaches a certain level, the n-MOST is turned on, making the potential of p-type region and thus $V_{DD}$ go down. The p⁺-region 096 and the conductor 097 in this figure is used for the connection of $V_{DD}$ with regions 094, 095 and 096.

Figure 14:
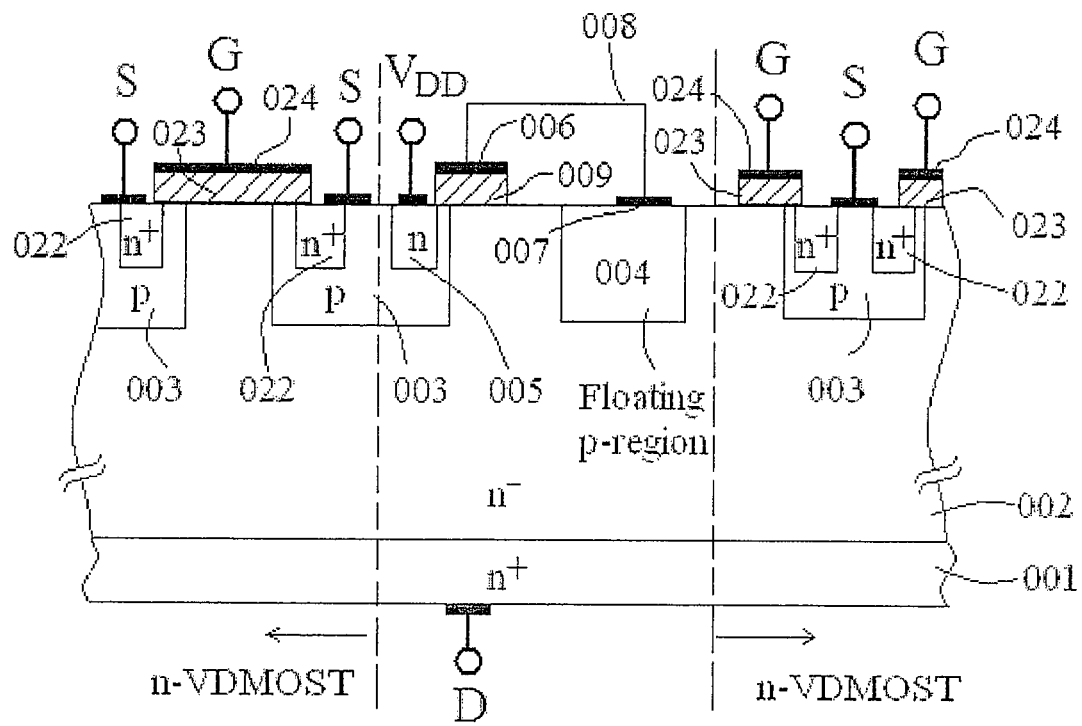
FIG. 14 schematically shows a situation that the p-type floating region in FIG. 12 is located in a portion between two n-VDMOST's.

In this invention, said p-type floating region (004) can be formed not only in a portion at one side of an active region of a VDMOST, but also in a portion between two neighbouring active regions of a VDMOST. Such a case is shown in FIG. 14, where two neighbouring active regions are located out of each side of the two dashed lines. In such active regions, 003, 022, 023, and 024 represent p-type source-body region, n⁺-type source region, gate oxide (or other dielectric layer) and gate, respectively. In the portion between the two dashed lines, the structure is the same as that in FIG. 12. P-type region 004 and regions of 003 at both sides have the lowest potential. When the drain voltage $V_{DS}$ is increased to such a value, that either depletion region of both sides extends to the edge of 004, a positive voltage will be induced on 004. When the induced positive voltage approaches the threshold voltage of the surface of region 003, $V_{DD}$ will be charged, as described according to FIG. 12.

Figure 15:
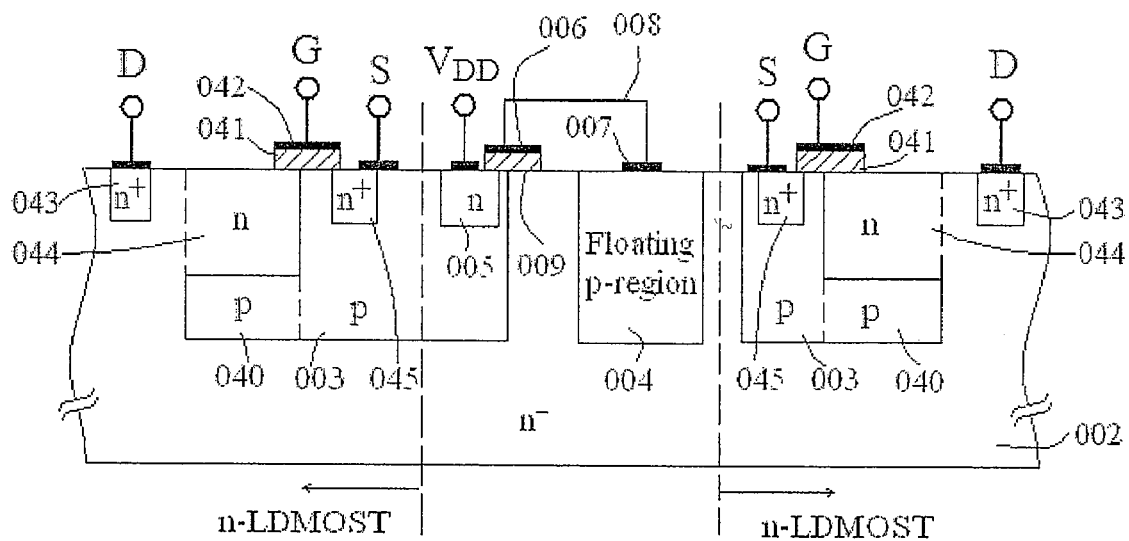
FIG. 15 schematically shows a situation that the p-type floating region in FIG. 12 is located in a portion between two n-LDMOST's.

The low-voltage power supply not only can be implemented in VDMOST but also can be implemented in LDMOST. FIG. 15 shows that a low-voltage power supply is implemented in LDMOST. The portions from source electrode S to drain electrode D of the n-LDMOST are formed by the method described in Ref. [3], and the structure is the same as that of the LDMOST shown in FIG. 6. As the potentials of p-type regions in contact with source electrode S are zero, when $V_{DS}$ is increased to a certain value, n⁻-region 002 at either side of 004 will be fully depleted, inducing a positive voltage on p-type floating region 004 to S. The positive voltage is applied through the electrode 007 and wire 008 to gate 006, where an insulator 009 is underneath it. As the gate 006 covers a part of source region 005, the part of surface of n⁻-region 002 and the portion of the p-type region 003 between them, the n-MOST formed by a drain region 002, a source region 005 and a source-body region 003 is turned on if the voltage between gate 006 and source-body region 003 reaches the threshold voltage. Thus, an output voltage $V_{DD}$ from the n-type region 005 is produced.

Figure 16:
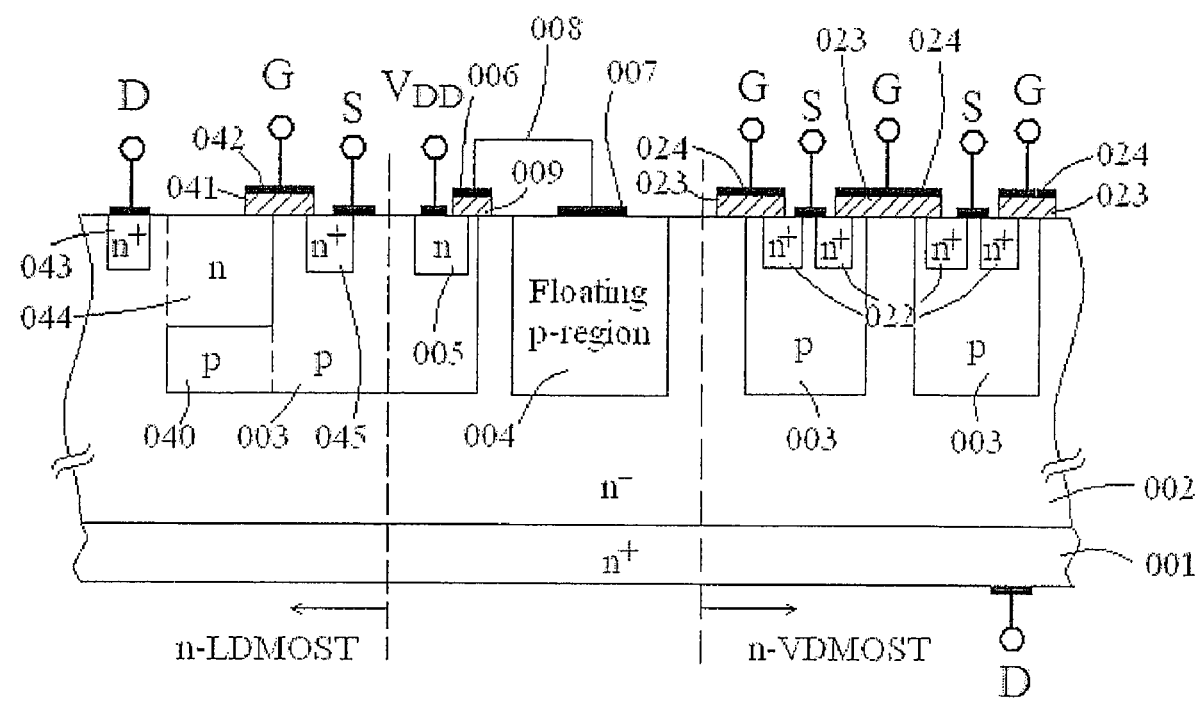
FIG. 16 schematically shows a situation that the p-type floating region in FIG. 12 is located in a portion between an n-VDMOST and an n-LDMOST.

A low-voltage power supply can also be implemented through a structure in which VDMOST and LDMOST are both formed, as shown in FIG. 16. In this figure, the left portion of the left dashed line is an n-LDMOST, the right portion of the right dashed line is an n-VDMOST. In the source-body region 003 of the n-LDMOST, an n-MOST source region 005 is formed, also, an output terminal $V_{DD}$ of the low-voltage power supply on the top of 005. The n-MOST has a dielectric layer 009, on which there is the gate electrode 006 that is connected to the electrode contact 007 of the p-type floating region 004 via wire 008. The theory of generating $V_{DD}$ is the same as that presented to FIG. 15.

Figure 17A:
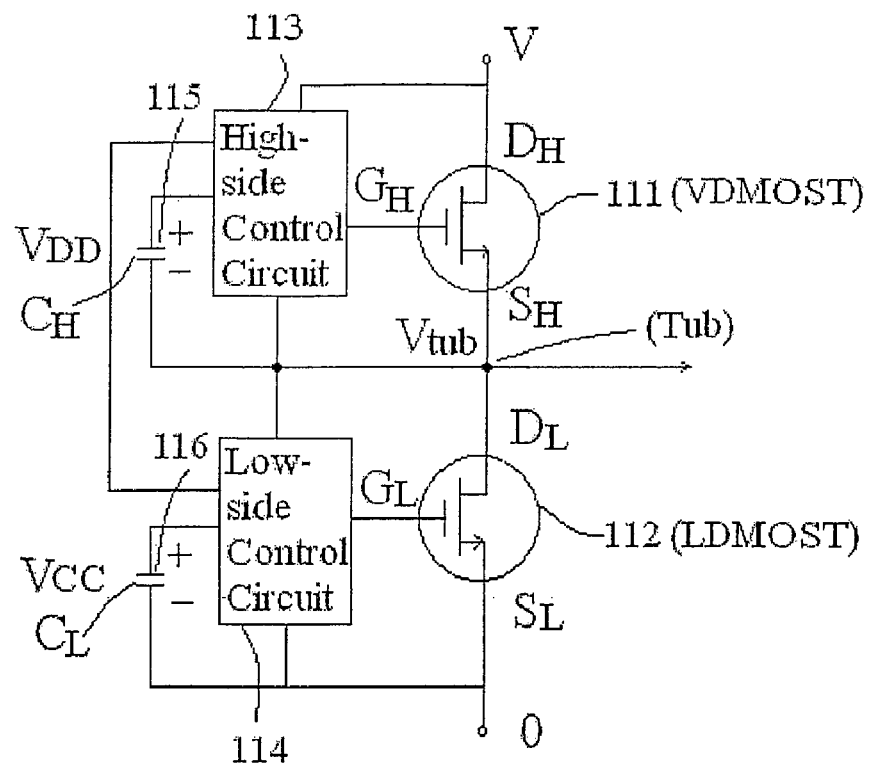
FIG. 17(a) schematically shows that in a Totem-pole connection a low-voltage power supply ($V_{DD}$) and a low-voltage power supply ($V_{CC}$) are needed by a high-side control circuit and a low-side control circuit.

Low-voltage power supplies for driving circuits for high-side and low-side devices in totem-pole connection can also be implemented by utilizing p-type floating regions. FIG. 17(a) shows a totem-pole connection composed of a high-voltage n-VDMOST 111 and a high-voltage n-LDMOST 112 and their driving circuits 113 and 114. In this figure, D, S, and G represent drain electrode, source electrode and gate electrode, respectively. The subscripts H and L represent high-side transistor and low-side transistor, respectively. High-side transistor and low-side transistor are connected to the high voltage V in series. The connection point of high-side transistor and low-side transistor is called as tub. Under the condition that high-side transistor and low-side transistor are switched on and off alternatively, the potential of the tub may approach V or zero. The two output terminals to the load are the terminal tub and the terminal labelled as "0" or "V". High-side transistor or low-side transistor is switched off when its gate to source voltage approaches zero. In order to make high-side transistor on, a driving circuit 113 for high-side transistor is needed to generate a positive voltage to tub. Similarly, a driving circuit 114 for low-side transistor is needed to generate a positive voltage to "0". Obviously, the two driving circuits need two voltage power supplies: one is a positive voltage terminal 116 to "0", another is a positive voltage terminal 115 to tub. In the figure, the two power supplies are represented by capacitor $C_H$ and $C_L$, with voltages $V_{DD}$ and $V_{CC}$ on them, respectively.

Figure 17B:
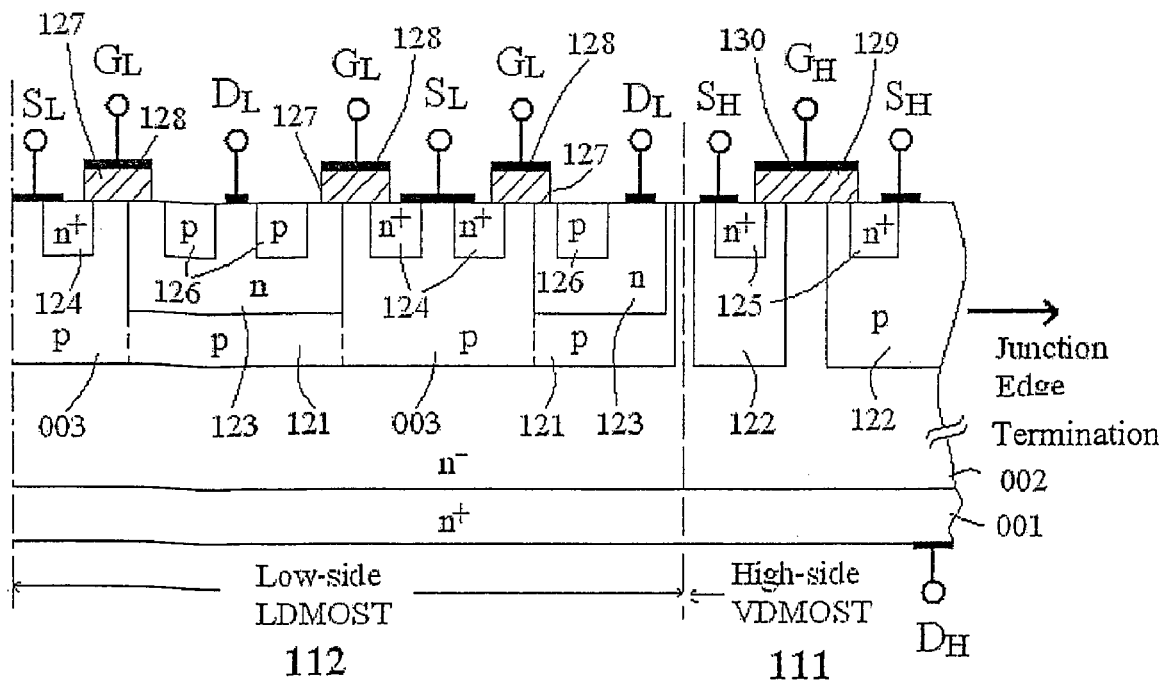
FIG. 17(b) schematically shows a cross section view of a structure, in which device 111 and device 122 in FIG. 17(a) are integrated together.

FIG. 17(b) shows a method of integrating 111 and 112 in FIG. 17(a) within one chip. In this figure, n-LDMOST is implemented using the method described in Ref. [3]. The dashed dot line represents the centre of the n-LDMOST. There are three cells of the n-LDMOST in the portion 112, which is between the dashed dot line and the dashed line, wherein the p-type region 003 is the source-body region of the n-LDMOST; the n-type region 123 is the electron drift region. The surface voltage-sustaining region is formed by p-type region 126, n-type region 123 and p-type region 121. The region 126 can be connected to source electrode $S_L$ via outer wire in a portion close to $S_L$, or can be directly connected to the p-type region 003 in a portion close to $S_L$ as shown in FIG. 8(b). The gate electrode $G_L$ of n-LDMOST is formed by conductor 128, under which there is a gate dielectric layer 127; the gate covers part of source region 124, drift region 123 and the surface of p-type region 003. The drain electrode $D_L$ is formed on the top of the n-type drift region 123, where the location is most far away from the source region.

In the portion 111, n-VDMOST are formed. The figure shows two cells of VDMOST in parallel, each includes source region 125, source-body region 122 with source electrode $S_H$ on top, gate electrode $G_H$ with gate conductor 130 and gate dielectric layer 129, and drain electrode $D_H$ at the bottom of the substrate. The edge termination locates in a portion from the cutting line to the right and even to outside portion of the figure.

Of course, it doesn't necessarily mean that the numbers of cells of n-LDMOST and VDMOST must be the same as shown in FIG. 17(b). In fact, other numbers can be used.

Figure 17C:
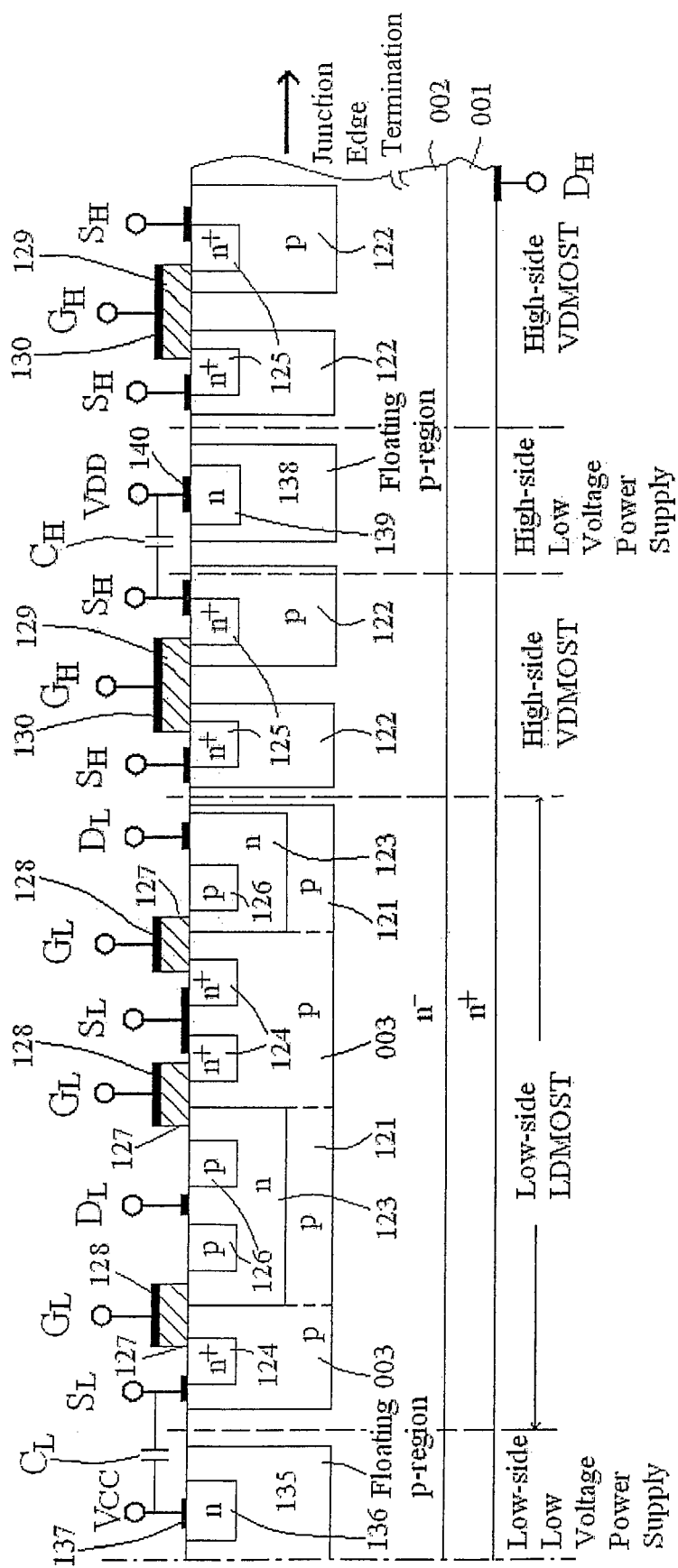
FIG. 17(c) schematically shows a cross section view of a structure, in which, in addition to the device in FIG. 17(b), the p-type floating regions for voltage power supply $V_{DD}$ and $V_{CC}$ are also integrated.

The method of implementing the two positive voltage power supplies $V_{CC}$ and $V_{DD}$ to $S_L$ and $S_H$ shown in FIG. 17(a) are schematically illustrated in FIG. 17(c), where 111 and 112 in FIG. 17(a) are also integrated within the same chip. The two outer capacitors $C_L$ and $C_H$ are used for 116 and 115 shown in FIG. 17(a), respectively. They are charged by p-type floating region 135 and p-type floating region 138 having potential higher than $S_L$ and $S_H$ through the diodes formed by n-type region 136 and n-type region 139 inside 135 and 138 as well as conductors 137 and 140, respectively.

Figure 18A:
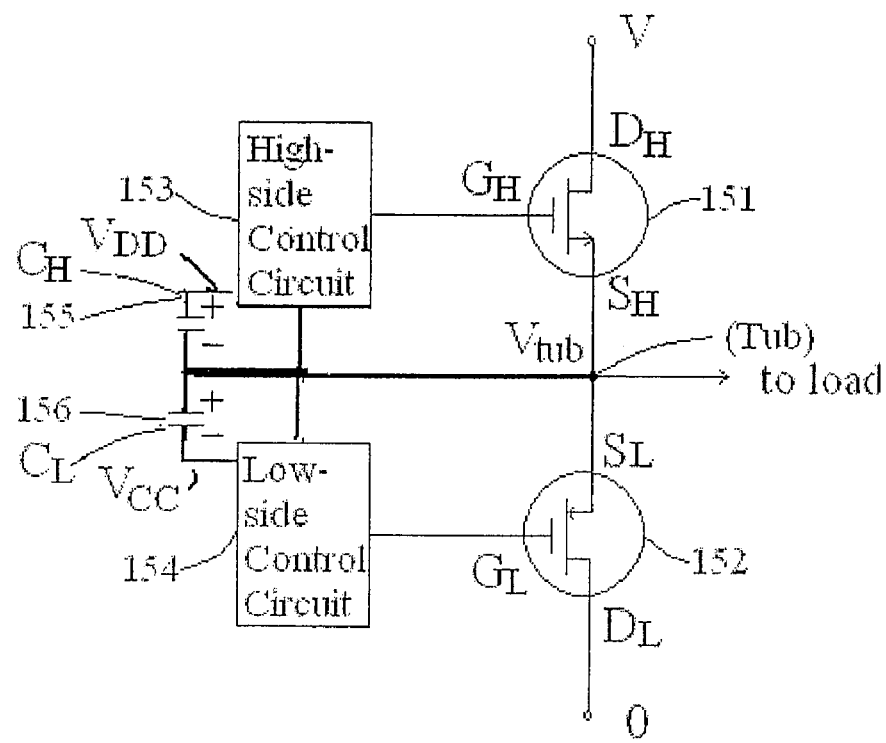
FIG. 18(a) schematically shows a positive voltage power supply ($V_{DD}$) and a negative voltage power supply ($V_{CC}$) taking tub as reference for the high-side control circuit and low-side control circuit, respectively.

Low-voltage power supplies for CMOS drivers can also be implemented by utilizing floating regions, as shown in FIG. 18(a). They have positive voltage $V_{DD}$ and negative voltage $V_{CC}$ to the connection point of the two sources. In this figure, 151 is the high-side n-MOST and 152 is the low-side p-MOST, the connection point called "tub". Under the condition that the high-side MOST and the low-side MOST are switched on and off alternatively, the potential of the tub $V_{tub}$ may approaches V (the potential of substrate) or zero. The output terminals to the load are tub and terminal "0" or tub and terminal "V". In order to operate the high-side transistor, there is a high-side driving circuit 153, which can provide either a positive voltage or a nearly-zero voltage to the gate of the high-side transistor. Similarly, in order to operate the low-side transistor, there is a low-side driving circuit 154, which can provide either a negative voltage or a nearly-zero voltage to the gate of the low-side transistor. Obviously, the two driving circuits need a positive voltage power supply and a negative voltage power supply to the tub. In this figure, the two voltage power supplies 156 and 155 are represented by capacitors $C_L$ and $C_H$, respectively.

Figure 18B:
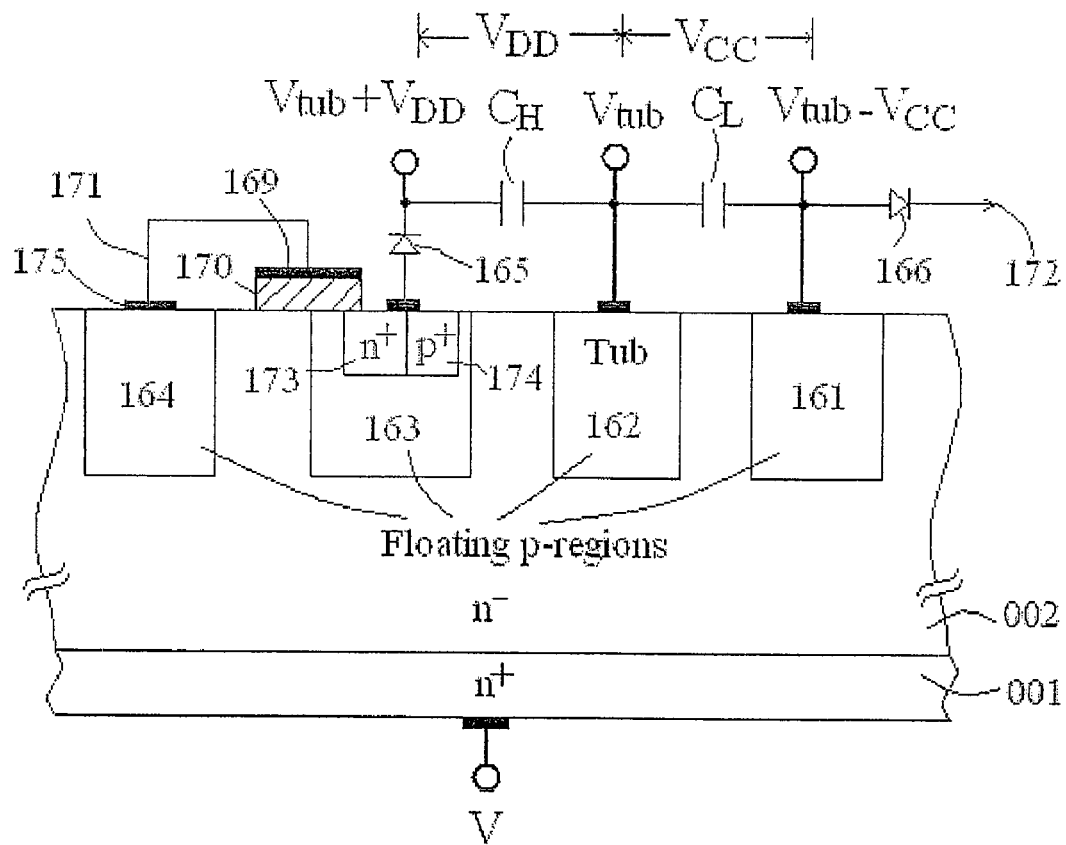
FIG. 18(b) schematically shows the implementation of the two low-voltage power supplies illustrated in FIG. 18(a) through two p-type floating regions.

FIG. 18(b) schematically shows the method of implementing the two power supplies, one of which can provide positive voltage and the other can provide negative voltage to tub. In this figure, the cathode of diode 166 has a wire 172 which is connected to terminal "0" shown in FIG. 18(a) (but not shown in this figure) via a resistor or a device, so that the p-type floating region has a negative voltage to the substrate. The leftmost portion of this figure is connected to a voltage-sustaining region of the edge termination. Thus the potentials of p-type floating regions increase in the order of 161, 162, 163, and 164. An electrode 175 is set on the top of the undepleted portion of 164, 175 is in turn connected to a gate 169 via a wire 171. There is a gate dielectric layer 170 underneath 169, which covers the surface of 163, a part of surface of 002, and a part of the surface $n^+$-region 173 inside of 163. The $n^+$-region 173 is connected to $p^+$ region 174 via an ohmic contact and is connected to the anode of 165. When the voltage of gate to source (173) is higher than the threshold voltage of p-type region 163, electrons can flow from $n^+$ region 173, via the inversion layer in the surface portion of the p-type region 163 to the n-region 002 and finally reaches terminal "V". That means a current from terminal "V" can charge the outer capacitor $C_H$ via diode 165. The charging current also charges $C_L$ and then flows from diode 166 via route 172 and reaches terminal "0". The joint point of capacitors $C_L$ and $C_H$ is connected to the floating region 162, which is formed as the tub or a part of the tub.

The value of $V_{DD}$ from positive voltage power supply $C_H$ and the value of $V_{CC}$ from negative voltage power supply $C_L$ are not only determined by the distance between floating regions and doping distribution of the floating region, but also can be controlled by outer circuit. For example, if $V_{DD}$ is too high, a bypass circuit between 171 and 162 can be set, making the voltage between gate 169 and source-body region lower than the threshold voltage of the n-MOST and thus the charging process is off. On the contrary, if $V_{DD}$ is too low, the bypass circuit will not work, making capacitor $C_H$ charging. A similar method can be used to control of the value of $V_{CC}$.

In FIG. 18(a), when the high-side transistor is turned-on, the potential of tub (162 in FIG. 18(b)) approaches V, and the potential of floating region 163 is lower than that of the tub, leading to a leakage of charge from capacitor $C_H$ to 162 via 163. Therefore, a diode 165 is used. Similarly, to prevent charge leakage from $C_H$, a diode 166 is used. Of course, those diodes can also be formed inside the floating region.

Figure 18C:
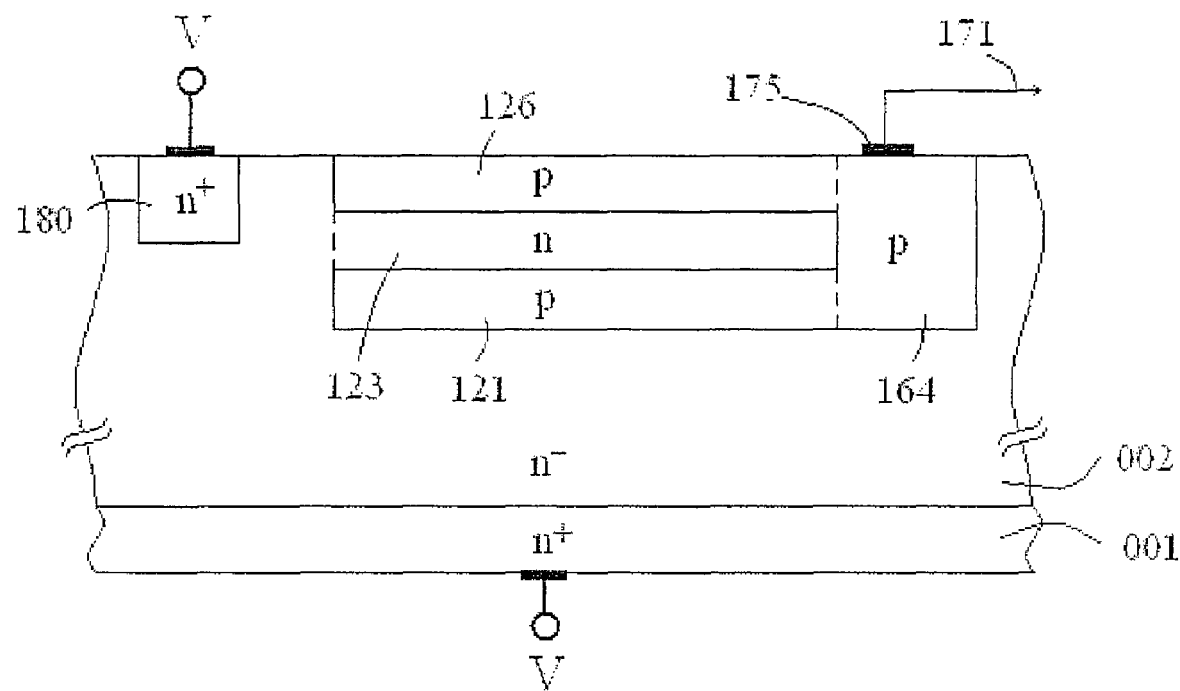
FIG. 18(c) schematically shows a cross section view of a device structure, wherein variation lateral doping is used for edge termination for region 171 in FIG. 18(b).

The left portion of FIG. 18(b) is connected to the surface voltage-sustaining region for edge termination. There are many methods can be applied for this region. One of methods is shown in FIG. 18(c), wherein a structure in Ref. [3] is utilized. The structure in this figure has included 164 of FIG. 18(b), where the $n^+$-region 180 has the same potential V with the substrate.

Figure 18D:
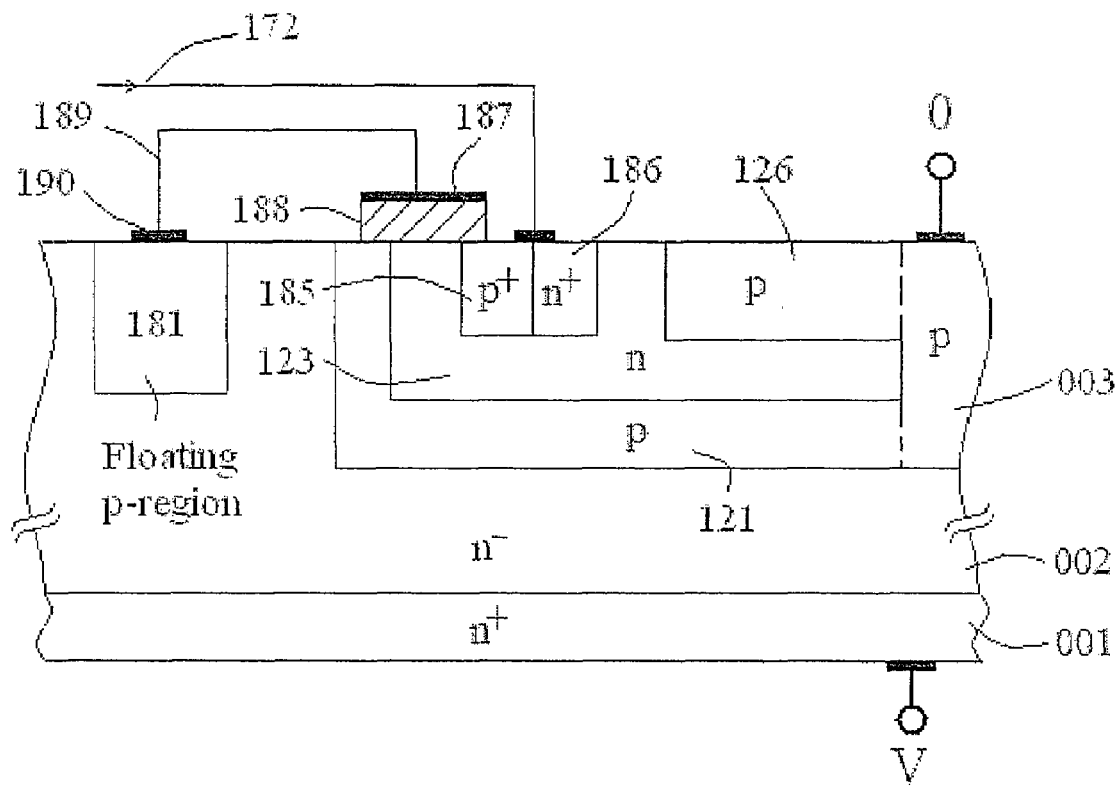
FIG. 18(d) schematically shows a cross section view of a device structure, wherein 172 in FIG. 18(b) is connected to the terminal 0 via an on-state p-MOST.

The area between the right portion of FIG. 18(b) and the terminal "0" can be implemented with a device by using the method in Ref. [3]. An example of such a device is shown in FIG. 18(d). In this figure, the surface voltage-sustaining region includes p-type region 121, p-type region 126 and the n-type region 123 between 121 and 126. A p-MOST is formed by a dielectric layer 188 that is deposited on a part of the surface of p-type region 185 and a part of surface of 121, and the surface of n-type region 123 between them, a gate 187 is formed on 188 and is connected to contact layer 190 via a wire 189, a p$^+$-source region 185 is connected to the source-body region via n$^+$-region and ohmic contact and then connected to wire 172 (the same as wire 172 in FIG. 18(b)), and a drain region is located in the leftmost surface portion of p-type region 121. Obviously, the potential of source region 185 is lower than p-type region 181, where the voltage drop on diode 166 in FIG. 18(b) has been ignored. That means the voltage from gate to source is negative and the p-MOST can be turned-on under a proper design. Thus, a current flows starting from 172 to 185, and then through p-MOST, region 121 and 003, and finally reaches terminal "0".

It should be noted that a p-type floating region is again used to provide gate voltage here.

Figure 19:
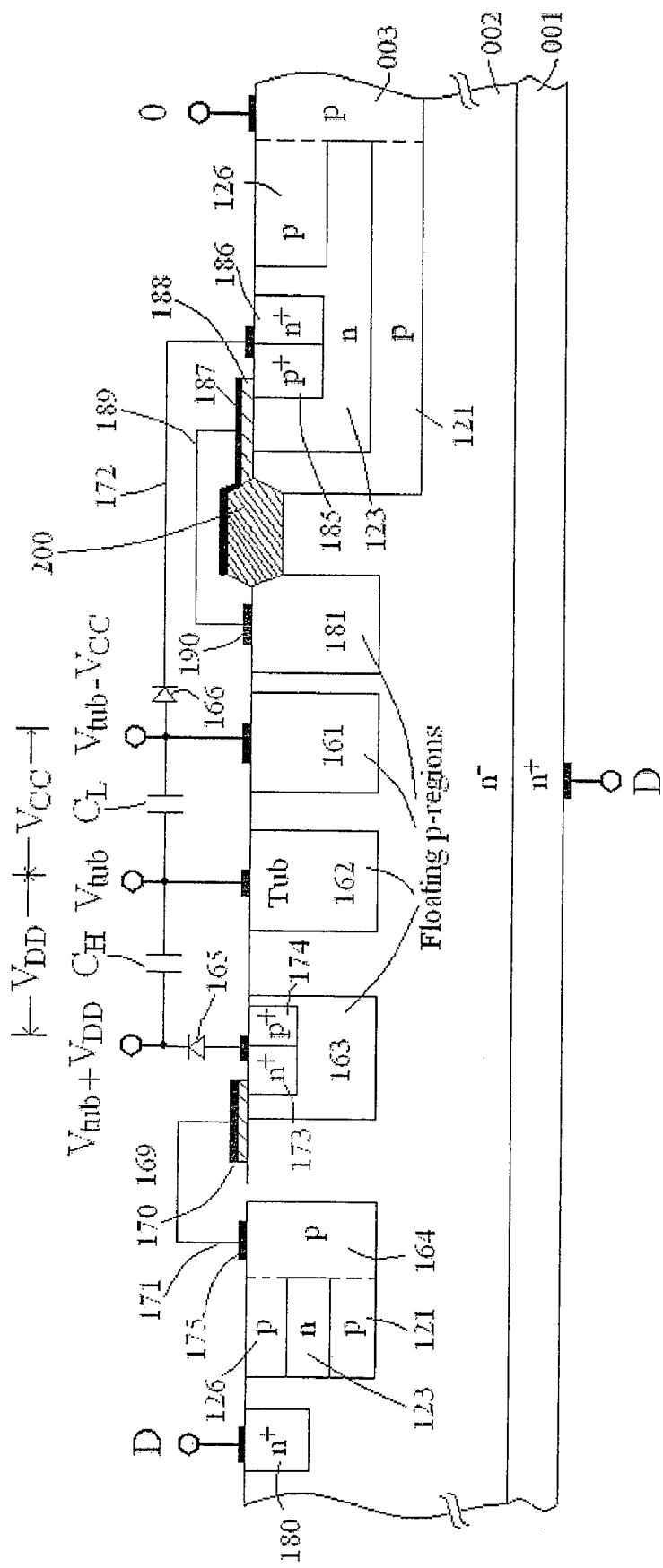
FIG. 19 schematically shows the integration of the devices shown in FIG. 18(b), FIG. 18(c) and FIG. 18(d).

A method of integrating the structures of FIG. 18(b), FIG. 18(c) and FIG. 18(d) is shown in FIG. 19. Not to mention, control circuits can also be added. Therefore, a positive voltage power supply and a negative voltage power supply with tub as reference can be made. In FIG. 19, 200 is a thick dielectric layer, such as a field oxide, which is used for preventing a high electric field produced under the edge of the conductor on top of a thin dielectric layer 188.

Figure 20:
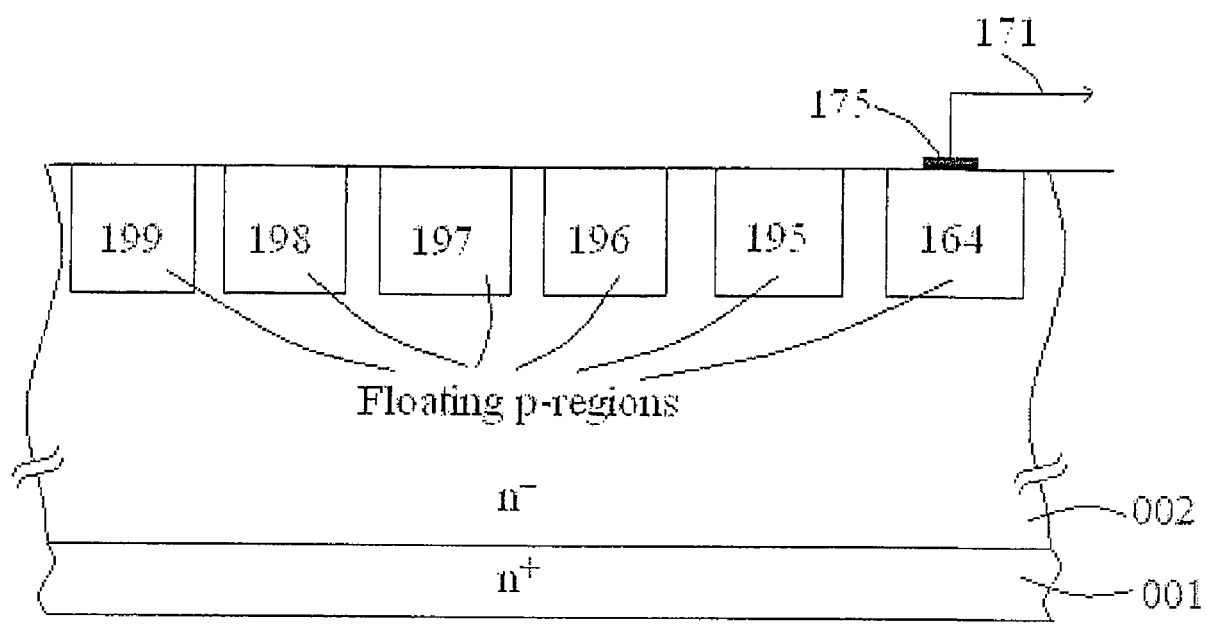
FIG. 20 schematically shows the cross section view of the edge termination for region 171 in FIG. 18(b).

FIG. 20 shows a method of forming an edge termination by utilizing floating field limiting ring, which extends from the left portion of the structure in FIG. 18(b) to the substrate having a potential of V. The p-type floating regions 195, 196, 197, 198, 199 are all floating field limiting rings. Furthermore, even the p-type floating region 164 can also be a floating field limiting ring.

Although in all of the cases stated starting from FIG. 12, the voltage of a p-type floating region is used as a gate voltage to control a MOST for producing a low voltage, it is obvious that the method can be applied to use other devices instead of a MOST. For example, a p-type floating region is connected to the gate of a JFET. Furthermore, the p-type floating region can be connected to the base of a bipolar transistor. Thus, the method can be applied extensively to other devices.

Apparently, in above cases, all of the n-type regions and all of the p-type regions can be exchanged one to another, the device then changes to a device of a conductivity of opposite type. In addition, said dielectric layer surely can be $SiO_2$.

It should also be mentioned that, only high-voltage devices are described in above cases. However, for those skilled in the art, it is easy to understand that said high-voltage and low-voltage are relative terms. This invention can be applied to medium-voltage or low-voltage semiconductor devices for implementing comparatively low-voltage power supply.

The techniques proposed by this invention have been illustrated by many examples of implementation of low-voltage power supply with an isolated floating region. It should be understood that various changes and modifications to the preferred embodiments described herein will be apparent to those skilled in the art. Such changes and modifications may be made without departing from the spirit and scope of present invention and without diminishing its attendant advantages. It is therefore, intended that such changes and modifications be covered by the appended claims.

This invention provides a method of implementing a low-voltage power supply in a chip containing high-voltage device with a semiconductor substrate of a first conductivity type, by utilizing the potential of a floating region of a second conductivity type as an output of the low-voltage power supply, or as a control voltage on a transistor for providing current to the low-voltage power supply. The other output terminal of the low-voltage power supply may be either of the two terminals that apply a high voltage on the high-voltage device or a floating terminal. Using this method, low-voltage power supply can be implemented not only for the low-voltage integrated circuit in power IC that contains one high-voltage device, but also for the low-voltage integrated circuit in a power IC containing high-side high-voltage device and low-side high-voltage device in a totem-pole connection or a power IC containing CMOS connection. As there is no need to implement depletion mode device in the chip, the fabrication cost is reduced.

Although this invention has been described and illustrated with reference to specific examples thereof, it is not intended that the invention be limited to these illustrative examples. Various changes and modifications can be made to the preferred embodiments for those skilled in the art. The selection and description of examples is to well present the theory and application of the invention, so that those skilled in the art can understand the invention and can do design for specific application with some modification and changes.

The invention claimed is:

1. A semiconductor device comprising:
   a semiconductor substrate of a first conductivity type and at least one first region of a second conductivity type located underneath a first major surface of said semiconductor device; an external reverse bias voltage is applied across said substrate of a first conductivity type and said first region of a second conductivity type;
   wherein at least one second region of a second conductivity type is formed underneath said first major surface, said second region of a second conductivity type is isolated from any one of said first region of a second conductivity type;
   under an external applied reverse bias voltage, at least one said second region of a second conductivity type has an undepleted neutral portion at an intermediate electrical potential and is surrounded by the depleted region of said substrate, wherein said intermediate electrical potential is between the potential of neutral portion of said substrate of a first conductivity type and the potential of first region of a second conductivity type;
   said second region of a second conductivity type with intermediate electrical potential is an initiation region of a low-voltage power supply;
   a low-voltage power supply is produced directly on two terminals, wherein one terminal is a contact to said initiation region and another terminal is a contact to any other neutral portion, or indirectly on two output terminals of a normally-off three-terminal semiconductor device, wherein one input terminal of said normally-off three-terminal semiconductor device is connected to said initiation region and another input terminal is in common with one of two output terminals of said normally-off three-terminal semiconductor device.

2. A semiconductor device according to claim 1, wherein said normally-off three-terminal semiconductor device is an enhancement-mode MOSFET; the source-body region of said MOSFET is formed in a first region of a second conductivity type; the source region is a small region of a first conductivity type and is formed inside the source-body region; the drain region of said MOSFET is the substrate of a first conductivity type; the input terminal of said MOSFET is the gate of said MOSFET and one of said two output terminal is the source of said MOSFET.

3. A low-voltage power supply according to claim 1, wherein said initiation region is simultaneously connected to a bypass circuit, which is used to control the electrical potential of said initiation region.

4. A semiconductor device according to claim 1, wherein said semiconductor device is a high-voltage device; said first conductivity type is N type; said second conductivity type is P type; or said first conductivity type is P type; said second conductivity type is N type.

5. A semiconductor device according to claim 1, wherein a diode and a capacitor are connected in series between the two output terminals; two terminals of said capacitor are used to provide current for a low-voltage IC.

6. A semiconductor device according to claim 1, wherein said terminal located in said initiation region is connected indirectly through a second region of a first conductivity type, wherein said second region of a first conductivity type is inside of said initiation region.

7. A semiconductor device according to claim 1, wherein said second region of a second conductivity type is a floating field limiting ring.

8. A low-voltage power supply provided by any of semiconductor device according to claim 1, which is used as the power supply for the low-voltage IC for control of said semiconductor device.

9. Low-voltage power supplies provided by any of semiconductor device according to claim 1, which can be used as the power supply for the low-voltage driver of high-side high-voltage device and the power supply for the low-voltage driver of low-side high-voltage device;
wherein said low-side high-voltage device is an LDMOST formed by paralleled connection of at least one interdigitated cell formed in the surface portion; wherein each cell has a first region of a second conductivity type having a largest voltage to said substrate and a floating region of a first conductivity type connected through an electrode of a tub; wherein said tub has a voltage to said substrate varying from zero to almost the largest value;
wherein said initiation region of a second conductivity type is surrounded by a ring of a first conductivity type contact directly the substrate, and said ring of a first conductivity type is surrounded in turn by a ring of said first region of a second conductivity type, which is also used as the source-body region of the LDMOST;
wherein each cell of said LDMOST has a surface voltage-sustaining region starting from said first region of a second conductivity type having a largest voltage up to said floating region of a first conductivity type of each cell of LDMOST;
wherein said surface voltage-sustaining region of said LDMOST consists of at least a bottom (first) layer of semiconductor of the second conductivity type and a second layer of semiconductor of the first conductivity type; and may have still other layers being arranged in order of number from bottom layer to top, where the layers of odd number are semiconductor of the second conductivity type and the layers of even number are semiconductor of the first conductivity type;
wherein the layers of odd number or at least the first layer are (is) connected directly or through conductors to the terminal having a largest potential; at least one layer of even number are connected directly or through conductor(s) to the terminal having a potential varying from zero to almost the largest value;
wherein the total thickness of said surface voltage-sustaining region is much smaller than the depletion width of a one-sided abrupt junction made by the same substrate under its breakdown voltage;
said largest voltage is positive (or negative) when the substrate is p-type (or n-type) semiconductor;
wherein the dose of the first layer of said surface voltage-sustaining region of said LIGBT decreases with the lateral distance from the largest voltage terminal, from a value close to but not larger than $2D_0$ to a value close to but smaller than $D_0$ at the smallest voltage terminal;
wherein the dose $D_0$ means the number of the depleted impurities of the semiconductor of the second conductivity type in a unit area of a one-sided abrupt plane junction made by the same substrate;
wherein the dose of the last (top) layer of any said surface voltage-sustaining region should be not larger than $D_0$,
wherein the dose of any layer besides the first and the last layer should be not larger than $2D_0$ at the place close to the largest voltage terminal, and should be not larger than $1.8D_0$ at the place of the smallest voltage terminal;
wherein an effective density of impurity, referring to the sum of the densities of the layers having odd number subtracted by the sum of the densities of the layers having even number, an effective density decreases gradually or stepwise from a value of $D_0$ at the terminal of the largest voltage to a value of zero at the terminal of the smallest voltage;
wherein the density means the amount of ionized impurities in an area divided by the area, and the dimension of the area in any direction is much smaller than the depletion width of a one-sided abrupt plane junction made by the same substrate under its breakdown voltage;
wherein the drift region of said LDMOST is even-number layers and the drain of the low-side high-voltage device is formed by connection of each even-number layer in the floating voltage region with a conductor on the surface, which is the tub electrode.

\* \* \* \* \*